(12) United States Patent
Matsubara et al.

(10) Patent No.: US 12,160,226 B2
(45) Date of Patent: Dec. 3, 2024

(54) HIGH FREQUENCY MODULE AND COMMUNICATION APPARATUS

(71) Applicant: Murata Manufacturing Co., Ltd., Kyoto (JP)

(72) Inventors: Hiroshi Matsubara, Kyoto (JP); Hidemori Akagi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 294 days.

(21) Appl. No.: 17/822,152

(22) Filed: Aug. 25, 2022

(65) Prior Publication Data

US 2023/0060305 A1 Mar. 2, 2023

(30) Foreign Application Priority Data

Sep. 2, 2021 (JP) ................................ 2021-143447

(51) Int. Cl.
| | |
|---|---|
| *H03H 9/72* | (2006.01) |
| *H03H 7/46* | (2006.01) |
| *H03H 9/05* | (2006.01) |
| *H03H 9/64* | (2006.01) |
| *H03H 9/70* | (2006.01) |

(52) U.S. Cl.
CPC ............ *H03H 9/725* (2013.01); *H03H 7/463* (2013.01); *H03H 9/0561* (2013.01); *H03H 9/6406* (2013.01); *H03H 9/6483* (2013.01); *H03H 9/706* (2013.01)

(58) Field of Classification Search
CPC .. H03H 9/6483; H03H 9/0576; H03H 9/0542; H03H 7/1758; H03H 7/0115; H03H 9/02015; H03H 9/725

USPC ............... 333/175, 186–188, 193–196
See application file for complete search history.

(56) References Cited

U.S. PATENT DOCUMENTS

| | | | |
|---|---|---|---|
| 2018/0026606 A1* | 1/2018 | Takata | H04L 5/1461 |
| | | | 370/278 |
| 2019/0220722 A1 | 7/2019 | Matsubara | |
| 2020/0028479 A1 | 1/2020 | Ta et al. | |
| 2020/0186126 A1* | 6/2020 | Miyazaki | H03H 9/25 |

FOREIGN PATENT DOCUMENTS

| | | |
|---|---|---|
| JP | 2020-014204 A | 1/2020 |
| WO | 2018/062119 A1 | 4/2018 |

* cited by examiner

*Primary Examiner* — Rakesh B Patel
(74) *Attorney, Agent, or Firm* — Pearne & Gordon LLP

(57) ABSTRACT

A first filter is a hybrid filter including an acoustic wave filter, a plurality of first inductors, and a plurality of first capacitors. A high frequency module further includes a metal electrode layer covering at least part of a resin layer and at least part of an outer peripheral surface of a mounting substrate. Among a plurality of inductors including the plurality of first inductors of the first filter and a plurality of second inductors of a second filter, at least one inductor (the second inductor) is a circuit element including a conductor pattern portion formed in the mounting substrate. The shortest distance between the outer peripheral surface of the mounting substrate and a signal terminal (a third signal terminal) connected to the circuit element is longer than the shortest distance between the outer peripheral surface of the mounting substrate and the circuit element.

11 Claims, 16 Drawing Sheets

HIGH FREQUENCY MODULE AND COMMUNICATION APPARATUS

CROSS REFERENCE TO RELATED APPLICATION

This application claims priority from Japanese Patent Application No. 2021-143447 filed on Sep. 2, 2021. The content of this application is incorporated herein by reference in its entirety.

BACKGROUND ART

The present disclosure generally relates to a high frequency module and a communication apparatus, and more specifically relates to a high frequency module including a hybrid filter and a communication apparatus including the high frequency module.

Japanese Unexamined Patent Application Publication No. 2020-14204 discloses a multiplexer including a first filter that is coupled to a common node and configured to filter a radio frequency signal, and a second filter coupled to the common node. The first filter includes a hybrid elastic LC filter (hybrid filter) and an inelastic LC filter cascade-connected to the hybrid elastic LC filter. The hybrid elastic LC filter includes an elastic resonator die, a capacitor disposed outside the elastic resonator die, and an inductor disposed outside the elastic resonator die.

In a high frequency module including a hybrid filter, for example, when a metal electrode layer connected to a ground terminal is formed as a shield layer, characteristics of the hybrid filter may be degraded.

BRIEF SUMMARY

The present disclosure provides a high frequency module and a communication apparatus capable of suppressing degradation in characteristics of a hybrid filter.

A high frequency module according to an aspect of the present disclosure includes a mounting substrate, a first signal terminal, a second signal terminal, a third signal terminal, a ground terminal, a first filter, and a second filter. The mounting substrate has a first principal surface and a second principal surface opposing each other. The first signal terminal, the second signal terminal, the third signal terminal, and the ground terminal are disposed on the second principal surface of the mounting substrate. The first filter is connected between the first signal terminal and the second signal terminal. The first filter is a hybrid filter including an acoustic wave filter, a plurality of first inductors, and a plurality of first capacitors. The acoustic wave filter includes at least one acoustic wave resonator. The second filter is connected between the first signal terminal and the third signal terminal. The second filter includes a plurality of second inductors and a plurality of second capacitors. A pass band width of the hybrid filter is larger than a pass band width of the acoustic wave resonator. The acoustic wave filter is mounted on the first principal surface of the mounting substrate. The plurality of first inductors, the plurality of first capacitors, the plurality of second inductors, and the plurality of second capacitors are disposed in or on the mounting substrate. The high frequency module further includes a resin layer and a metal electrode layer. The resin layer is disposed on the first principal surface of the mounting substrate and covers at least part of the acoustic wave filter. The metal electrode layer covers at least part of the resin layer and at least part of an outer peripheral surface of the mounting substrate. The metal electrode layer is connected to the ground terminal. At least one inductor among a plurality of inductors including the plurality of first inductors and the plurality of second inductors is a circuit element including a conductor pattern portion formed in the mounting substrate. A shortest distance between the outer peripheral surface of the mounting substrate and a signal terminal out of the second signal terminal and the third signal terminal connected to the circuit element is longer than a shortest distance between the outer peripheral surface of the mounting substrate and the circuit element.

A communication apparatus according to an aspect of the present disclosure includes the above-described high frequency module and a signal processing circuit. The signal processing circuit is connected to the high frequency module.

The high frequency module and the communication apparatus according to the above aspects of the present disclosure may suppress the degradation in characteristics of the hybrid filter.

DETAILED DESCRIPTION

Figure 1:
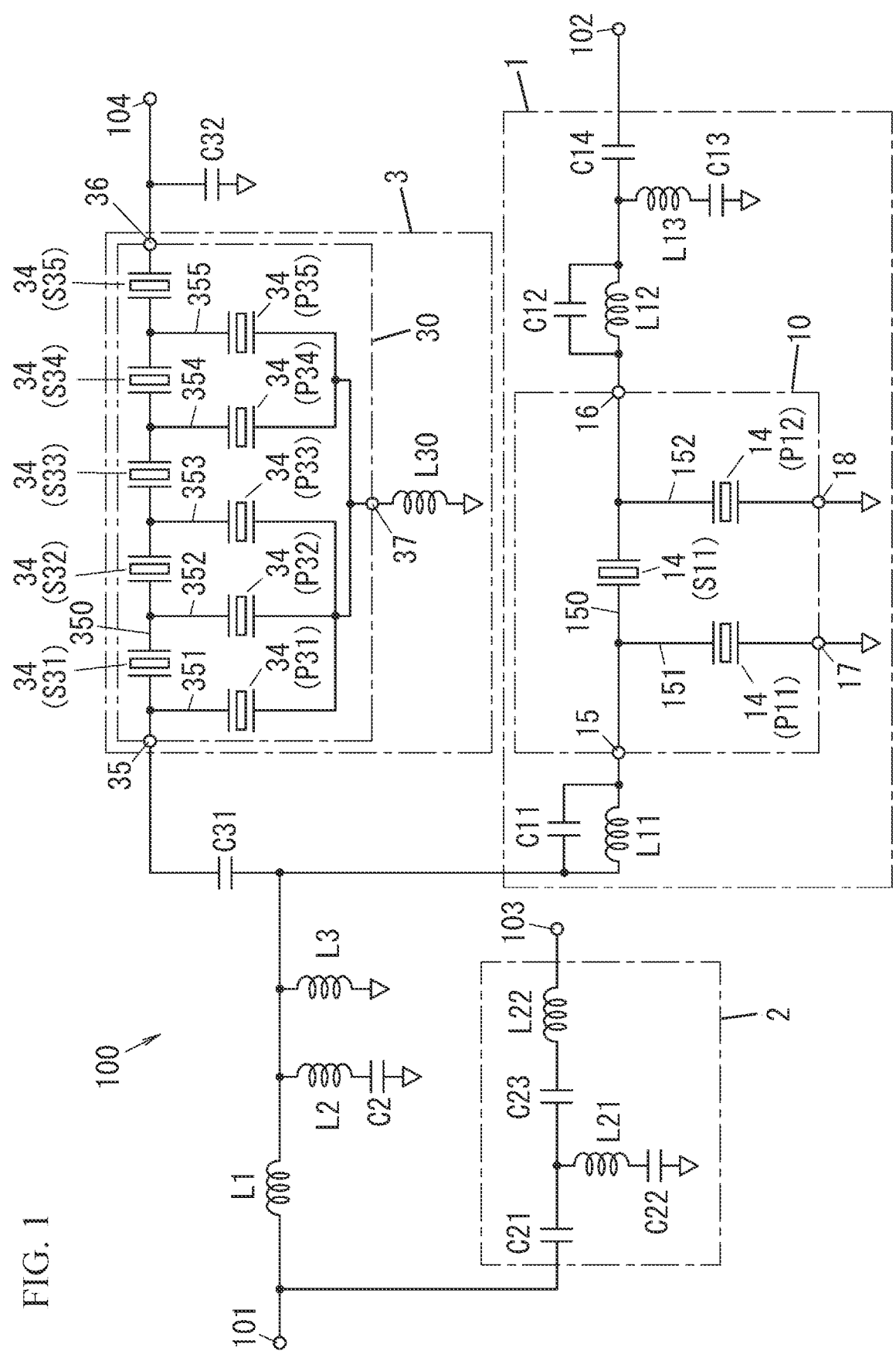
FIG. 1 is a circuit diagram of a high frequency module according to Embodiment 1.

Each of the drawings referred to in the following embodiments and the like is a schematic drawing, and the ratios of sizes, thicknesses, and the like of the constituent elements in the drawings do not necessarily reflect actual dimensional ratios.

Embodiment 1

Hereinafter, a high frequency module 100 and a communication apparatus 300 according to Embodiment 1 will be described with reference to FIGS. 1 to 11.

1. Overview

As illustrated in FIG. 1, the high frequency module 100 according to Embodiment 1 includes a first signal terminal 101, a second signal terminal 102, a third signal terminal 103, a ground terminal 107 (see FIG. 2), a first filter 1, and a second filter 2. The first filter 1 is connected between the first signal terminal 101 and the second signal terminal 102. "The first filter 1 is connected between the first signal terminal 101 and the second signal terminal 102" means that the first filter 1 is connected to both the first signal terminal 101 and the second signal terminal 102 between the first signal terminal 101 and the second signal terminal 102. The first filter 1 is a hybrid filter 1 including an acoustic wave filter 10, a plurality of first inductors L11 to L13, and a plurality of first capacitors C11 to C14. The acoustic wave filter 10 (hereinafter, also referred to as the first acoustic wave filter 10) includes at least one (for example, three) acoustic wave resonator 14. The pass band width of the hybrid filter 1 is larger than the pass band width of the acoustic wave resonator 14. The pass band width of the acoustic wave resonator 14 is a fractional bandwidth of the acoustic wave resonator 14, and is a difference between an anti-resonant frequency and a resonant frequency of the acoustic wave resonator 14. The term "hybrid filter" refers to a filter including an acoustic wave filter having at least one acoustic wave resonator, at least one capacitor, and at least one inductor, and is a filter having a pass band width wider than the pass band width of the at least one acoustic wave resonator. The second filter 2 is connected between the first signal terminal 101 and the third signal terminal 103. "The second filter 2 is connected between the first signal terminal 101 and the third signal terminal 103" means that the second filter 2 is connected to both the first signal terminal 101 and the third signal terminal 103 between the first signal terminal 101 and the third signal terminal 103. The second filter 2 includes a plurality of second inductors L21 and L22 and a plurality of second capacitors C21 to C23.

Figure 2:
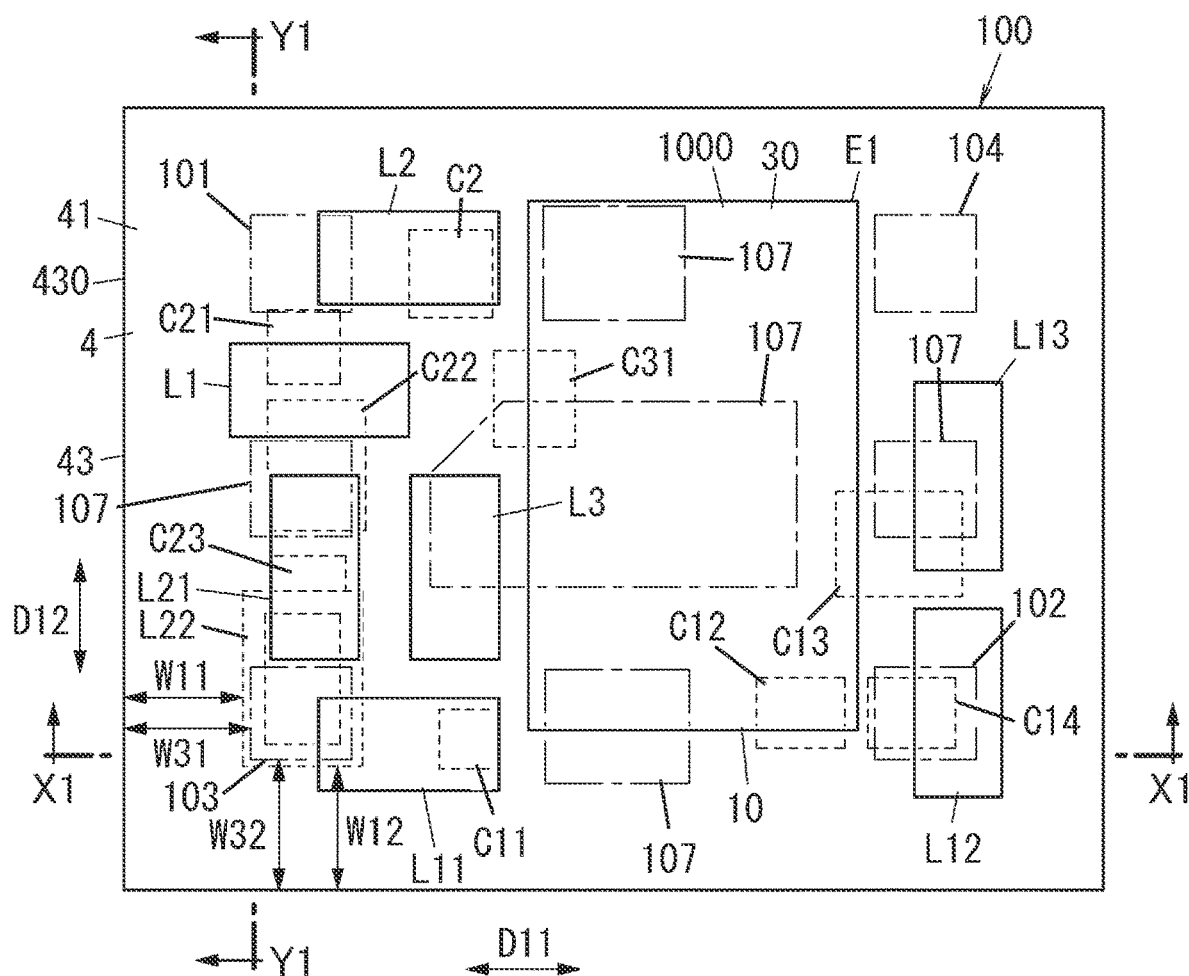
FIG. 2 is a plan view of the high frequency module.
Figure 3:
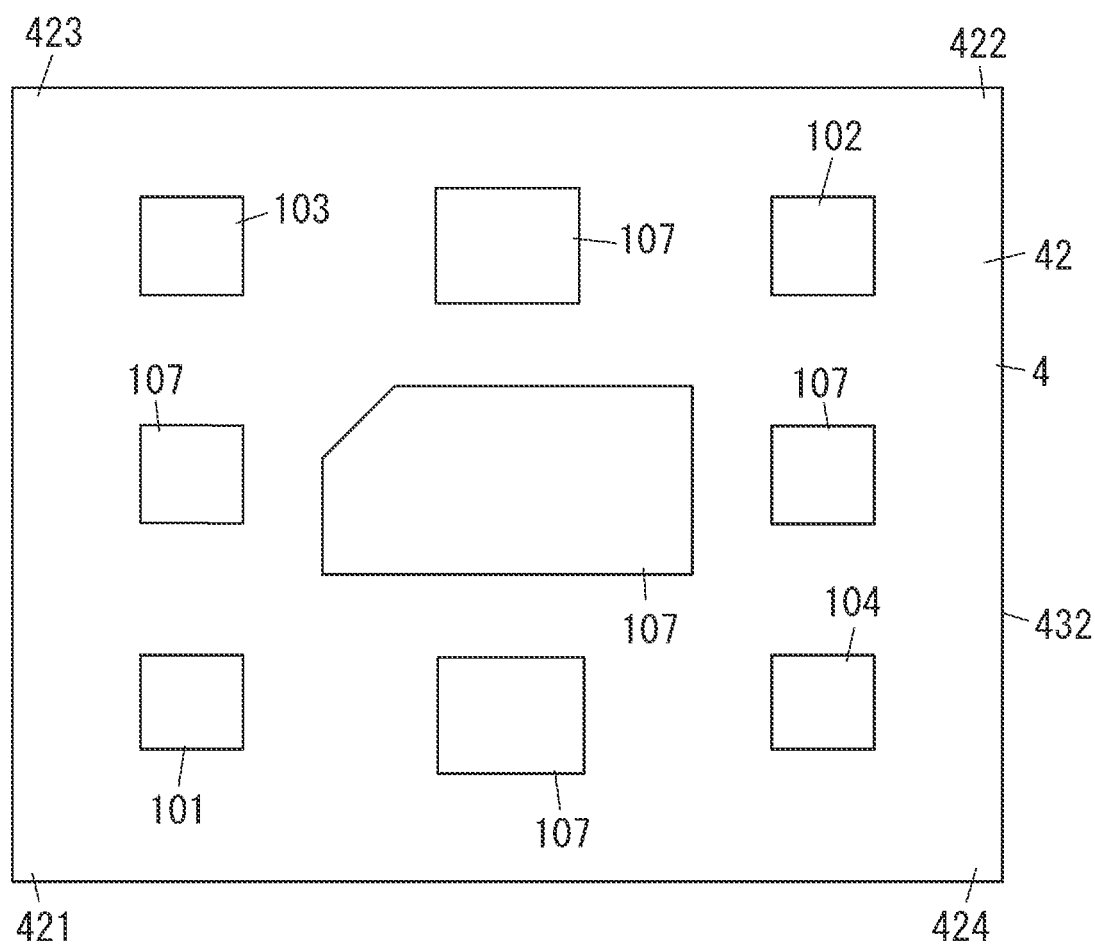
FIG. 3 is a bottom view of the high frequency module.
Figure 4:
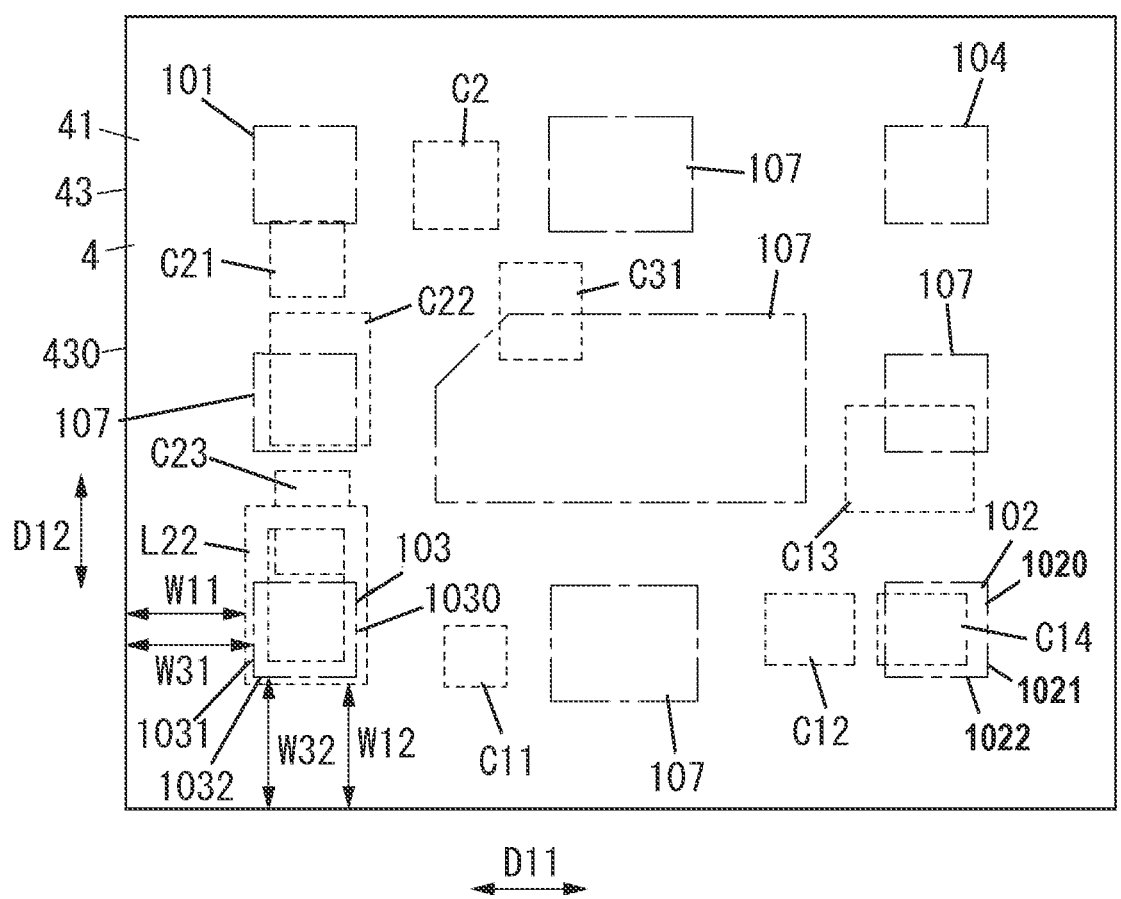
FIG. 4 is a plan view of a mounting substrate in the high frequency module.
Figure 5:
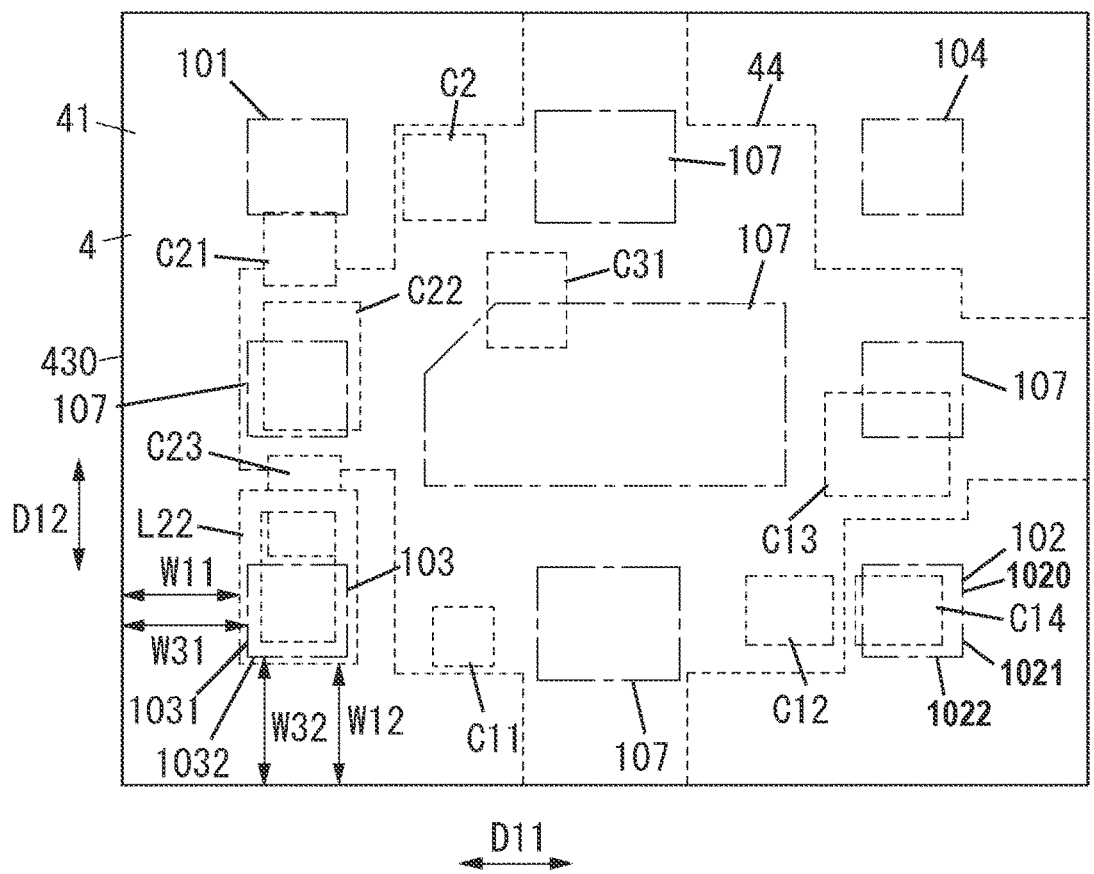
FIG. 5 is another plan view of the mounting substrate in the high frequency module.
Figure 6:
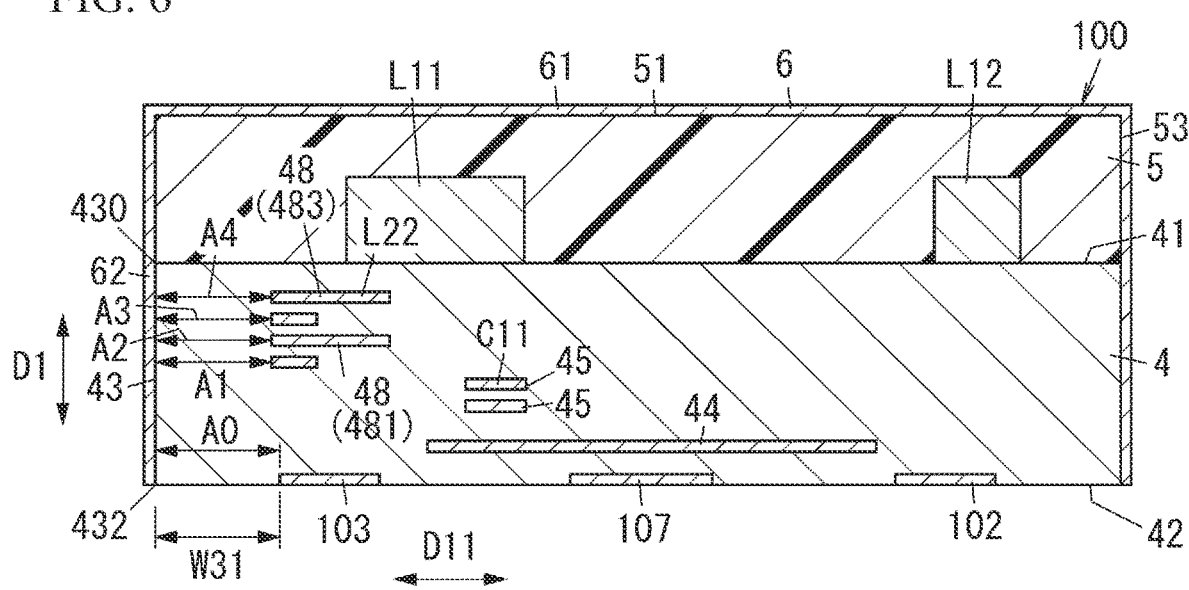
FIG. 6 illustrates a cross-sectional view of the high frequency module taken along a line X1-X1 in FIG. 2.
Figure 7:
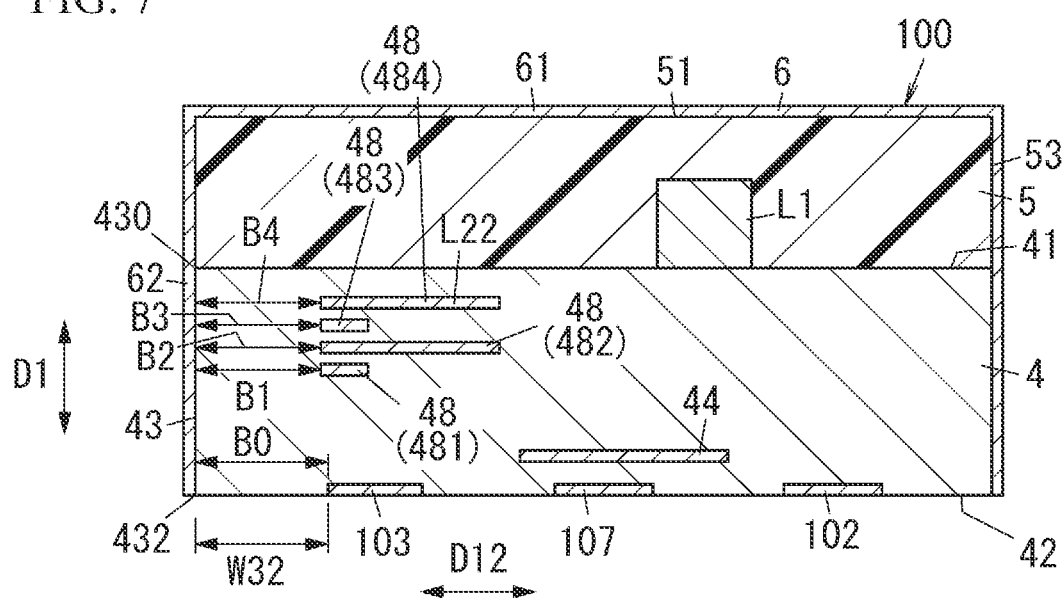
FIG. 7 illustrates a cross-sectional view of the high frequency module taken along a line Y1-Y1 in FIG. 2.
Figure 8:
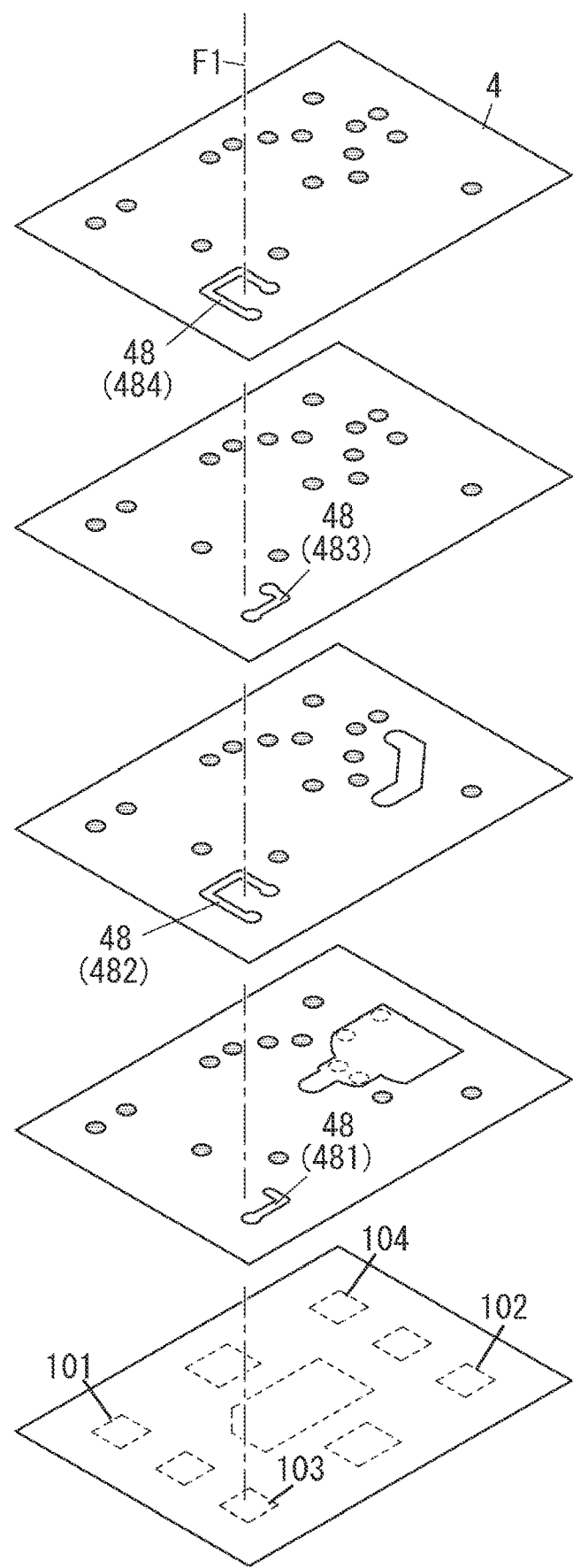
FIG. 8 is a perspective view seeing through the interior of the mounting substrate in the high frequency module.

As illustrated in FIGS. 2 to 6, the high frequency module 100 includes a mounting substrate 4. As illustrated in FIGS. 6 and 7, the mounting substrate 4 has a first principal surface 41 and a second principal surface 42 opposing each other. In this case, the expression "opposing" does not refer to opposing physically, but refers to opposing geometrically. As illustrated in FIG. 3, the first signal terminal 101, the second signal terminal 102, the third signal terminal 103, and the ground terminal 107 are disposed on the second principal surface 42 of the mounting substrate 4. As illustrated in FIG. 2, the first acoustic wave filter 10 is mounted on the first principal surface 41 of the mounting substrate 4. The plurality of first inductors L11, L12, and L13, the plurality of first capacitors C11, C12, C13, and C14, the plurality of second inductors L21 and L22, and the plurality of second capacitors C21, C22, and C23 are disposed in or on the mounting substrate 4. As illustrated in FIGS. 6 and 7, the high frequency module 100 further includes a resin layer 5 and a metal electrode layer 6. The resin layer 5 is disposed on the first principal surface 41 of the mounting substrate 4. The resin layer 5 covers at least part of the acoustic wave filter 10. The metal electrode layer 6 covers at least part of the resin layer 5 and at least part of an outer peripheral surface 43 of the mounting substrate 4. Although not illustrated, the metal electrode layer 6 is connected to the ground terminal 107. At least one inductor (the second inductor L22 in an example of FIG. 6) among a plurality of inductors including the plurality of first inductors L11, L12, and L13 and the plurality of second inductors L21 and L22 is a circuit element (for example, an inner layer inductor) including a conductor pattern portion 48 formed in the mounting substrate 4. In FIGS. 2 to 5, illustration of the resin layer 5 and the metal electrode layer 6 is omitted.

As illustrated in FIG. 1, the high frequency module 100 further includes a fourth signal terminal 104 and a third filter 3. The third filter 3 is connected between the first signal terminal 101 and the fourth signal terminal 104. "The third filter 3 is connected between the first signal terminal 101 and the fourth signal terminal 104" means that the third filter 3 is connected to both the first signal terminal 101 and the fourth signal terminal 104 between the first signal terminal 101 and the fourth signal terminal 104. The third filter 3 includes a second acoustic wave filter 30 and a third inductor L30. The second acoustic wave filter 30 is connected between the first signal terminal 101 and the fourth signal terminal 104.

As illustrated in FIG. 2, the second acoustic wave filter 30 is mounted on the first principal surface 41 of the mounting substrate 4. The fourth signal terminal 104 is disposed on the second principal surface 42 of the mounting substrate 4. The third inductor L30 (see FIG. 1) is an inductance component of a wiring line connecting a ground electrode 37 (see FIG. 1) of the second acoustic wave filter 30 and the ground terminal 107 of the mounting substrate 4.

The high frequency module 100 constitutes a multiplexer 110 (see FIG. 11) including the first filter 1 (hybrid filter 1), the second filter 2, and the third filter 3.

The high frequency module 100 according to Embodiment 1 will be described in more detail, after the circuit configuration of a high frequency circuit 200 including the high frequency module 100 and the circuit configuration of a communication apparatus 300 are described with reference to FIG. 11.

2. High Frequency Circuit Including High Frequency Module, and Communication Apparatus 2.1. Circuit Configurations of High Frequency Circuit Including High Frequency Module and Communication Apparatus The high frequency circuit 200 including the high frequency module 100 is used in, for example, the communication apparatus 300. The communication apparatus 300 is, for example, a mobile phone (for example, a smartphone), but is not limited thereto, and may be, for example, a wearable terminal (for example, a smart watch). The high frequency circuit 200 is a module compatible with, for example, the fourth generation mobile communication system (4G) standard, the fifth generation mobile communication system (5G) standard and the like. The 4G standard is, for example, the third generation partnership project (3GPP) long term evolution (LTE) standard. The 5G standard is, for example, the 5G New Radio (NR). The high frequency circuit 200 is, for example, a front-end circuit capable of supporting carrier aggregation and dual connectivity.

For example, the high frequency circuit 200 is configured to amplify a transmission signal input from a signal processing circuit 301, and output the amplified transmission signal to an antenna 309. The high frequency circuit 200 is configured to amplify a reception signal input from the antenna 309, and output the amplified reception signal to the signal processing circuit 301. The signal processing circuit 301 is not a constituent element of the high frequency circuit 200, but a constituent element of the communication apparatus 300 including the high frequency circuit 200. The high frequency circuit 200 is controlled by, for example, the signal processing circuit 301 included in the communication apparatus 300. The communication apparatus 300 includes the high frequency circuit 200 and the signal processing circuit 301. The communication apparatus 300 further includes the antenna 309. The communication apparatus 300 further includes a circuit board where the high frequency module 100 is mounted. The circuit board is, for example, a printed wiring board. The circuit board includes a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC) and performs signal processing on a high frequency signal. For example, the RF signal processing circuit 302 performs signal processing such as up-conversion on a high frequency signal (transmission signal) output from the baseband signal processing circuit 303, and outputs the high frequency signal on which the signal processing has been performed. For example, the RF signal processing circuit 302 performs signal processing such as down-conversion on a high frequency signal (reception signal) output from the high frequency circuit 200, and outputs, to the baseband signal processing circuit 303, the high frequency signal on which the signal processing has been performed. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal or the like input from the outside. The baseband signal processing circuit 303 performs IQ modulation processing by combining the I-phase signal and the Q-phase signal to output a transmission signal. At this time, the transmission signal is generated as a modulation signal (IQ signal) by causing a carrier signal having a predetermined frequency to be subjected to amplitude modulation with a period longer than the period of the carrier signal. The reception signal processed by the baseband signal processing circuit 303 is used, for example, as an image signal for image display or as an audio signal for a phone call of a user of the communication apparatus 300. The high frequency circuit 200 transfers high frequency signals (reception signal, transmission signal) between the antenna 309 and the RF signal processing circuit 302 of the signal processing circuit 301.

The high frequency circuit 200 includes the multiplexer 110, a plurality of (for example, three) transmission filters (a first transmission filter 111, a second transmission filter 112, and a third transmission filter 113), and a plurality of (for example, three) reception filters (a first reception filter 121, a second reception filter 122, and a third reception filter 123). The high frequency circuit 200 includes a first switch 7, a second switch 8, and a third switch 9. The high frequency circuit 200 includes a plurality of (for example, three) power amplifiers (a first power amplifier 171, a second power amplifier 172, and a third power amplifier 173) and a plurality of (for example, three) low-noise amplifiers (a first low-noise amplifier 161, a second low-noise amplifier 162, and a third low-noise amplifier 163). The high frequency circuit 200 includes a plurality of (for example, three) output matching circuits (a first output matching circuit 131, a second output matching circuit 132, and a third output matching circuit 133) and a plurality of (for example, three) input matching circuits (a first input matching circuit 141, a second input matching circuit 142, and a third input matching circuit 143).

The high frequency circuit 200 includes a plurality of external connection terminals. The plurality of external connection terminals includes an antenna terminal T0 a first signal input terminal T11, a second signal input terminal T12, a third signal input terminal T13, a first signal output terminal T21, a second signal output terminal T22, a third signal output terminal T23, and a plurality of external ground terminals. Each of the plurality of external ground terminals is a terminal to which a ground potential is applied by being electrically connected to the ground electrode of the above-described circuit board included in the communication apparatus 300.

Hereinafter, the circuit configuration of the high frequency circuit 200 will be described in more detail.

The multiplexer 110 includes the first filter 1 (hybrid filter 1), the second filter 2, the third filter 3, the first signal terminal 101, the second signal terminal 102, the third signal terminal 103, and the fourth signal terminal 104 (see FIG. 1). The first signal terminal 101 is a common terminal connected to the first filter 1, the second filter 2 and the third filter 3, and is connected to the second signal terminal 102 with the first filter 1 interposed therebetween, connected to the third signal terminal 103 with the second filter 2 interposed therebetween, and connected to the fourth signal terminal 104 with the third filter 3 interposed therebetween. Each of the first signal terminal 101, the second signal terminal 102, the third signal terminal 103, and the fourth signal terminal 104 is an input/output terminal used for input and output of a high frequency signal. In the high frequency circuit 200, the first signal terminal 101 of the multiplexer 110 is connected to the antenna terminal T0 The antenna terminal TO is connected to the antenna 309.

The first transmission filter 111 has a pass band including the transmission band of a first communication band. The second transmission filter 112 has a pass band including the transmission band of a second communication band. The third transmission filter 113 has a pass band including the transmission band of a third communication band. In the multiplexer 110, the first transmission filter 111 is a filter for a mid band and a high band. The pass band of the first transmission filter 111 is included in a frequency band of 1710 MHz to 2690 MHz, for example. The second transmission filter 112 is a filter for an ultra high band. The pass band of the second transmission filter 112 is included in a frequency band of 3300 MHz to 5000 MHz, for example. The third transmission filter 113 is, for example, a filter for Wi-Fi (registered trademark) of the 2.4 GHz band. The transmission band of the third communication band includes, for example, a range from 2400 MHz to 2483 MHz. The first communication band is, for example, Band 41 of the 3GPP LTE standard or n41 of the 5G NR standard. The second communication band is, for example, n79 of the 5G NR standard. The first transmission filter 111 may be connected to the first filter 1 of the multiplexer 110 via the first switch 7. The second transmission filter 112 may be connected to the second filter 2 of the multiplexer 110 via the second switch 8. The third transmission filter 113 may be connected to the third filter 3 of the multiplexer 110 via the third switch 9.

The first reception filter 121 has a pass band including the reception band of a fourth communication band. The fourth communication band is, for example, the same as the first communication band. The second reception filter 122 has a pass band including the reception band of a fifth communication band. The fifth communication band is, for example, the same as the second communication band. The third reception filter 123 has a pass band including the reception band of a sixth communication band. The sixth communication band is, for example, the same as the third communication band. The first reception filter 121 may be connected to the first filter 1 of the multiplexer 110 via the first switch 7. The second reception filter 122 may be connected to the second filter 2 of the multiplexer 110 via the second switch 8. The third reception filter 123 may be connected to the third filter 3 of the multiplexer 110 via the third switch 9.

The first switch 7 includes a common terminal 70 and a plurality of (for example, two) selection terminals 71 and 72. In the first switch 7, the common terminal 70 is connected to the first filter 1 of the multiplexer 110. More specifically, the common terminal 70 is connected to the second signal terminal 102 of the high frequency module 100 (see FIG. 1) constituting the multiplexer 110, and is connected to the first filter 1 via the second signal terminal 102. In the first switch 7, the selection terminal 71 is connected to the first transmission filter 111, and the selection terminal 72 is connected to the first reception filter 121. The first switch 7 is controlled by, for example, the signal processing circuit 301. In this case, the first switch 7 switches a connection state between the common terminal 70 and the plurality of selection terminals 71 and 72 in accordance with a control signal from the RF signal processing circuit 302 of the signal processing circuit 301. The first switch 7 is, for example, a switching integrated circuit (IC). The first switch 7 is, for example, a switch capable of connecting at least one of the plurality of selection terminals 71 and 72 to the common terminal 70. In this case, the first switch 7 is, for example, a switch capable of one-to-one and one-to-many connections.

The second switch 8 includes a common terminal 80 and a plurality of (for example, two) selection terminals 81 and 82. In the second switch 8, the common terminal 80 is connected to the second filter 2 of the multiplexer 110. More specifically, the common terminal 80 is connected to the third signal terminal 103 of the high frequency module 100 (see FIG. 1) constituting the multiplexer 110, and is connected to the second filter 2 via the third signal terminal 103. In the second switch 8, the selection terminal 81 is connected to the second transmission filter 112, and the selection terminal 82 is connected to the second reception filter 122. The second switch 8 is controlled by, for example, the signal processing circuit 301. In this case, the second switch 8 switches a connection state between the common terminal 80 and the plurality of selection terminals 81 and 82 in accordance with a control signal from the RF signal processing circuit 302 of the signal processing circuit 301. The second switch 8 is, for example, a switching IC. The second switch 8 is, for example, a switch capable of connecting at least one of the plurality of selection terminals 81 and 82 to the common terminal 80. In this case, the second switch 8 is, for example, a switch capable of one-to-one and one-to-many connections.

The third switch 9 includes a common terminal 90 and a plurality of (for example, two) selection terminals 91 and 92. In the third switch 9, the common terminal 90 is connected to the third filter 3 of the multiplexer 110. More specifically, the common terminal 90 is connected to the fourth signal terminal 104 of the high frequency module 100 (see FIG. 1) constituting the multiplexer 110, and is connected to the third filter 3 via the fourth signal terminal 104. In the third switch 9, the selection terminal 91 is connected to the third transmission filter 113, and the selection terminal 92 is connected to the third reception filter 123. The third switch 9 is controlled by, for example, the signal processing circuit 301. In this case, the third switch 9 switches a connection state between the common terminal 90 and the plurality of selection terminals 91 and 92 in accordance with a control signal from the RF signal processing circuit 302 of the signal processing circuit 301. The third switch 9 is, for example, a switching IC. The third switch 9 is, for example, a switch capable of connecting at least one of the plurality of selection terminals 91 and 92 to the common terminal 90. In this case, the third switch 9 is, for example, a switch capable of one-to-one and one-to-many connections.

The first power amplifier 171 has an input terminal and an output terminal. The first power amplifier 171 amplifies the transmission signal input to the input terminal of the first power amplifier 171 and outputs the amplified transmission signal from the output terminal of the first power amplifier 171. The input terminal of the first power amplifier 171 is connected to the first signal input terminal T11. The input terminal of the first power amplifier 171 is connected to the signal processing circuit 301 via the first signal input terminal T11. The output terminal of the first power amplifier 171 is connected to the first transmission filter 111 via the first output matching circuit 131. The first power amplifier 171 is a power amplifier capable of amplifying a high frequency signal in the pass band of the first transmission filter 111. The first output matching circuit 131 is a circuit for impedance matching between the first power amplifier 171 and the first transmission filter 111, and includes, for example, a plurality of inductors and a plurality of capacitors.

The second power amplifier 172 has an input terminal and an output terminal. The second power amplifier 172 amplifies the transmission signal input to the input terminal of the second power amplifier 172 and outputs the amplified transmission signal from the output terminal of the second power amplifier 172. The input terminal of the second power amplifier 172 is connected to the second signal input terminal T12. The input terminal of the second power amplifier 172 is connected to the signal processing circuit 301 via the second signal input terminal T12. The output terminal of the second power amplifier 172 is connected to the second transmission filter 112 via the second output matching circuit 132. The second power amplifier 172 is a power amplifier capable of amplifying a high frequency signal in the pass band of the second transmission filter 112. The second output matching circuit 132 is a circuit for impedance matching between the second power amplifier 172 and the second transmission filter 112, and includes, for example, a plurality of inductors and a plurality of capacitors.

The third power amplifier 173 has an input terminal and an output terminal. The third power amplifier 173 amplifies the transmission signal input to the input terminal of the third power amplifier 173 and outputs the amplified transmission signal from the output terminal of the third power amplifier 173. The input terminal of the third power amplifier 173 is connected to the third signal input terminal T13. The input terminal of the third power amplifier 173 is connected to the signal processing circuit 301 via the third signal input terminal T13. The output terminal of the third power amplifier 173 is connected to the third transmission filter 113 via the third output matching circuit 133. The third power amplifier 173 is a power amplifier capable of amplifying a high frequency signal in the pass band of the third transmission filter 113. The third output matching circuit 133 is a circuit for impedance matching between the third power amplifier 173 and the third transmission filter 113, and includes, for example, a plurality of inductors and a plurality of capacitors.

The high frequency circuit 200 may further include a controller. The controller controls, for example, the first power amplifier 171, the second power amplifier 172, and the third power amplifier 173 in accordance with a control signal from the signal processing circuit 301.

The first low-noise amplifier 161 has an input terminal and an output terminal. The first low-noise amplifier 161 amplifies the reception signal input to the input terminal of the first low-noise amplifier 161 and outputs the amplified reception signal from the output terminal of the first low-noise amplifier 161. The input terminal of the first low-noise amplifier 161 is connected to the first reception filter 121 via the first input matching circuit 141. The first input matching circuit 141 is a circuit for impedance matching between the first low-noise amplifier 161 and the first reception filter 121. The first input matching circuit 141 includes, for example, an inductor. The output terminal of the first low-noise amplifier 161 is connected to the first signal output terminal T21. The output terminal of the first low-noise amplifier 161 is connected to the signal processing circuit 301 via the first signal output terminal T21, for example.

The second low-noise amplifier 162 has an input terminal and an output terminal. The second low-noise amplifier 162 amplifies the reception signal input to the input terminal of the second low-noise amplifier 162 and outputs the amplified reception signal from the output terminal of the second low-noise amplifier 162. The input terminal of the second low-noise amplifier 162 is connected to the second reception filter 122 via the second input matching circuit 142. The second input matching circuit 142 is a circuit for impedance matching between the second low-noise amplifier 162 and the second reception filter 122. The second input matching circuit 142 includes, for example, an inductor. The output terminal of the second low-noise amplifier 162 is connected to the signal processing circuit 301 via the second signal output terminal T22, for example.

The third low-noise amplifier 163 has an input terminal and an output terminal. The third low-noise amplifier 163 amplifies the reception signal input to the input terminal of the third low-noise amplifier 163 and outputs the amplified reception signal from the output terminal of the third low-noise amplifier 163. The input terminal of the third low-noise amplifier 163 is connected to the third reception filter 123 via the third input matching circuit 143. The third input matching circuit 143 is a circuit for impedance matching between the third low-noise amplifier 163 and the third reception filter 123. The third input matching circuit 143 includes, for example, an inductor. The output terminal of the third low-noise amplifier 163 is connected to the signal processing circuit 301 via the third signal output terminal T23, for example.

2.2. Circuit Configuration of High Frequency Module

As illustrated in FIG. 1, the high frequency module 100 includes the first signal terminal 101, the second signal terminal 102, the third signal terminal 103, the first filter 1 (hybrid filter 1), the second filter 2, and the third filter 3.

The hybrid filter 1 includes the first acoustic wave filter 10, the plurality of first inductors L11, L12, and L13, and the plurality of first capacitors C11, C12, C13, and C14. The first acoustic wave filter 10 includes at least one (for example, three) acoustic wave resonator 14. The first acoustic wave filter 10 is, for example, a surface acoustic wave filter utilizing surface acoustic waves. In this case, each of a plurality of the acoustic wave resonators 14 is a surface acoustic wave (SAW) resonator.

The first acoustic wave filter 10 is, for example, a π type filter. The first acoustic wave filter 10 includes three acoustic wave resonators 14, a first input/output electrode 15 connected to the first signal terminal 101, a second input/output electrode 16 connected to the second signal terminal 102, and two ground electrodes. The three acoustic wave resonators 14 include one series arm resonator S11 and two parallel arm resonators P11 and P12.

The series arm resonator S11 is provided on a path 150 (hereinafter, also referred to as a series arm path 150) between the first input/output electrode 15 and the second input/output electrode 16. The series arm resonator S11 is connected between the first signal terminal 101 and the second signal terminal 102.

The parallel arm resonator P11 is provided on a path 151 (parallel arm path 151) between a ground electrode 17 and a path between the first input/output electrode 15 and the series arm resonator S11 in the series arm path 150. The parallel arm resonator P12 is provided on a path 152 (parallel arm path 152) between a ground electrode 18 and a path between the series arm resonator S11 and the second input/output electrode 16 in the series arm path 150.

The first inductor L11 is connected between the first signal terminal 101 and the first acoustic wave filter 10. The first inductor L11 is connected in series to the first acoustic wave filter 10. More specifically, in the first inductor L11, one end of the first inductor L11 is connected to the first signal terminal 101, and the other end of the first inductor L11 is connected to the first input/output electrode 15 of the first acoustic wave filter 10. Thus, the first inductor L11 is connected in series to the series arm resonator S11 of the first acoustic wave filter 10.

The first inductor L12 is connected between the first acoustic wave filter 10 and the second signal terminal 102. The first inductor L12 is connected in series to the first acoustic wave filter 10. More specifically, in the first inductor L12, one end of the first inductor L12 is connected to the second input/output electrode 16 of the first acoustic wave filter 10, and the other end of the first inductor L12 is connected to the second signal terminal 102. Thus, the first inductor L12 is connected in series to the series arm resonator S11 of the first acoustic wave filter 10. The first inductor L12 is an inductor closest to the second signal terminal 102 on a signal path between the first signal terminal 101 and the second signal terminal 102.

In the first inductor L13, one end of the first inductor L13 is connected to a path between the first inductor L12 and the second signal terminal 102, and the other end of the first inductor L13 is connected to the ground (ground terminal 107) of the high frequency module 100. In the hybrid filter 1, the LC circuit connected between the first acoustic wave filter 10 and the second signal terminal 102 has a function of making the pass band width of the hybrid filter 1 wider than the pass band width of the acoustic wave resonator 14 and a function of serving as an impedance matching circuit. The LC circuit includes the first inductor L12, the first inductor L13, the first capacitor C12, the first capacitor C13, and the first capacitor C14.

The first capacitor C11 is connected in parallel to the first inductor L11. The parallel circuit of the first capacitor C11 and the first inductor L11 also functions as a phase-shift circuit.

The first capacitor C12 is connected in parallel to the first inductor L12.

The first capacitor C13 is connected in series to the first inductor L13. More specifically, the first capacitor C13 is connected between the first inductor L13 and the ground terminal 107 of the high frequency module 100.

The first capacitor C14 is connected between the first inductor L12 and the second signal terminal 102. The first capacitor C14 is connected in series to the first inductor L12.

The hybrid filter 1 has a larger pass band width than that in a case of being constituted by only the first acoustic wave filter 10. Further, in the hybrid filter 1, attenuation characteristics near the pass band are improved as compared with a case of being constituted by only the LC filter. The pass band width of the hybrid filter 1 is a frequency range in which the insertion loss is equal to or smaller than 3 dB in the filter characteristics. As discussed above, the pass band width of the hybrid filter 1 is larger than the pass band width of the acoustic wave resonator 14. The pass band width of the acoustic wave resonator 14 is a fractional bandwidth of the acoustic wave resonator 14, and is a difference between an anti-resonant frequency and a resonant frequency of the acoustic wave resonator 14.

The second filter 2 is an LC filter. The second filter 2 includes the plurality of second inductors L21 and L22, and the plurality of second capacitors C21, C22 and C23.

In the second filter 2, a series circuit of the second capacitor C21, the second capacitor C23, and the second inductor L22 is connected between the first and third signal terminals 101 and 103. In the second capacitor C21, one end of the second capacitor C21 is connected to the first signal terminal 101, and the other end of the second capacitor C21 is connected to one end of the second capacitor C23. In the second capacitor C23, the other end of the second capacitor C23 is connected to one end of the second inductor L22. In the second inductor L22, the other end of the second inductor L22 is connected to the third signal terminal 103.

In the second filter 2, a series circuit of the second inductor L21 and the second capacitor C22 is connected between the ground terminal 107 of the high frequency module 100 and a path between the second capacitors C21 and C23. In the second inductor L21, one end of the second inductor L21 is connected to the path between the second capacitor C21 and the second capacitor C23, and the other end of the second inductor L21 is connected to one end of the second capacitor C22. In the second capacitor C22, the other end of the second capacitor C22 is connected to the ground terminal 107 of the high frequency module 100.

The third filter 3 is connected between the first signal terminal 101 and the fourth signal terminal 104. The third filter 3 includes the second acoustic wave filter 30 and the inductor L30. The second acoustic wave filter 30 includes at least one (for example, ten) acoustic wave resonator 34. The second acoustic wave filter 30 is, for example, a surface acoustic wave filter utilizing surface acoustic waves. In this case, each of a plurality of the acoustic wave resonators 34 is a SAW resonator.

The second acoustic wave filter 30 is, for example, a ladder filter. The second acoustic wave filter 30 includes ten acoustic wave resonators 34, a first input/output electrode 35 connected to the first signal terminal 101, a second input/output electrode 36 connected to the fourth signal terminal 104, and the ground electrode 37. The ten acoustic wave resonators 34 include five series arm resonators S31, S32, S33, S34 and S35, and five parallel arm resonators P31, P32, P33, P34, and P35.

The five series arm resonators S31, S32, S33, S34, and S35 are provided on a path 350 (hereinafter, also referred to as a series arm path 350) between the first input/output electrode 35 and the second input/output electrode 36. The five series arm resonators S31, S32, S33, S34, and S35 are connected in series on the series arm path 350. In the second acoustic wave filter 30, the five series arm resonators S31, S32, S33, S34, and S35 are arranged on the series arm path 350 in the order of the series arm resonators S31, S32, S33, S34, and S35 from the first input/output electrode 35 side.

The parallel arm resonator P31 is provided on a path 351 (parallel arm path 351) between the ground electrode 37 and a path between the first input/output electrode 35 and the series arm resonator S31 in the series arm path 350. The parallel arm resonator P32 is provided on a path 352 (parallel arm path 352) between the ground electrode 37 and a path between the series arm resonator S31 and the series arm resonator S32 in the series arm path 350. The parallel arm resonator P33 is provided on a path 353 (parallel arm path 353) between the ground electrode 37 and a path between the series arm resonator S32 and the series arm resonator S33 in the series arm path 350. The parallel arm resonator P34 is provided on a path 354 (parallel arm path 354) between the ground electrode 37 and a path between the series arm resonator S33 and the series arm resonator S34 in the series arm path 350. The parallel arm resonator P35 is provided on a path 355 (parallel arm path 355) between the ground electrode 37 and a path between the series arm resonator S34 and the series arm resonator S35 in the series arm path 350.

The inductor L30 is an inductance component of a wiring line connecting the ground electrode 37 of the second acoustic wave filter 30 and the ground terminal 107.

The high frequency module 100 further includes a capacitor C32. The capacitor C32 is a capacitance component of a wiring line connecting the ground terminal 107 and a path between the second acoustic wave filter 30 and the fourth signal terminal 104.

The high frequency module 100 further includes an inductor L1, an inductor L2, an inductor L3, and a capacitor C2. The inductor L1 is connected between the first filter 1 and the third filter 3. The inductor L1 has a function of matching the impedance between the first filter 1 and third filter 3, and the first signal terminal 101, for example. A series circuit of the inductor L2 and the capacitor C2 is connected between the ground and a common path for a path between the first filter 1 and the first signal terminal 101 and a path between the third filter 3 and the first signal terminal 101. More specifically, the series circuit of the inductor L2 and the capacitor C2 is connected between the ground and a path between the inductor L1 and a connection point of the first filter 1 and the third filter 3. The series circuit of the inductor L2 and the capacitor C2 has a function of attenuating harmonic waves in the pass band of the first filter 1 and harmonic waves in the pass band of the third filter 3. The inductor L3 is connected between the above-mentioned common path and the ground. More specifically, the inductor L3 is connected in parallel to the series circuit of the inductor L2 and the capacitor C2. The inductor L3 is an inductor serving as measures against electro-static discharge (ESD).

The high frequency module 100 further includes a capacitor C31 connected between the first signal terminal 101 and the third filter 3.

2.3. Structure of High Frequency Module

Hereinafter, the structure of the high frequency module 100 will be described with reference to FIGS. 2 to 10.

As illustrated in FIG. 2, the high frequency module 100 includes the mounting substrate 4, the first signal terminal 101, the second signal terminal 102, the third signal terminal 103, the fourth signal terminal 104, and a plurality of the ground terminals 107. The high frequency module 100 includes the first acoustic wave filter 10, the plurality of first inductors L11, L12, and L13, the plurality of first capacitors C11, C12, C13, and C14, the plurality of second inductors L21 and L22, and the plurality of second capacitors C21, C22, and C23. The high frequency module 100 further includes the second acoustic wave filter 30, the third inductor L30, the capacitor C31, and the capacitor C32 (see FIG. 1). The high frequency module 100 further includes the inductor L1, the inductor L2, the inductor L3, and the capacitor C2. As illustrated in FIGS. 6 and 7, the high frequency module 100 further includes the resin layer 5 and the metal electrode layer 6.

The mounting substrate 4 has the first principal surface 41 and the second principal surface 42 opposing each other in a thickness direction D1 of the mounting substrate 4. The mounting substrate 4 is, for example, a multilayer substrate including a plurality of dielectric layers and a plurality of conductive layers. The plurality of dielectric layers and the plurality of conductive layers are laminated in the thickness direction D1 of the mounting substrate 4. The plurality of conductive layers is formed in a predetermined pattern determined for each layer. Each of the plurality of conductive layers includes one or a plurality of conductors in one plane orthogonal to the thickness direction D1 of the mounting substrate 4. The material of each conductive layer is, for example, copper. The plurality of conductive layers includes a ground conductor 44. In the high frequency module 100, the ground terminal 107 and the ground conductor 44 are electrically connected to each other through a via conductor or the like included in the mounting substrate 4. The mounting substrate 4 is, for example, a low temperature co-fired ceramics (LTCC) substrate. The mounting substrate 4 is not limited to the LTCC substrate, and may be, for example, a printed wiring board, a high temperature co-fired ceramics (HTCC) substrate, or a resin multilayer substrate. In a plan view from the thickness direction D1 of the mounting substrate 4, an outer edge 430 of the first principal surface 41 and an outer edge 432 of the second principal surface 42 (see FIGS. 6 and 7) of the mounting substrate 4 have a rectangular shape (for example, a rectangle shape).

The mounting substrate 4 is not limited to the LTCC substrate, and may be, for example, a wiring structure. The wiring structure is, for example, a multilayer structure. The multilayer structure includes at least one insulating layer and at least one conductive layer. The insulating layer is formed in a predetermined pattern. When there exists a plurality of insulating layers, the plurality of insulating layers is formed in a predetermined pattern determined for each layer. The conductive layer is formed in a predetermined pattern different from the predetermined pattern of the insulating layer. When there exists a plurality of conductive layers, the plurality of conductive layers is formed in the predetermined pattern determined for each layer. The conductive layer may include one or a plurality of re-wiring portions. In the wiring structure, of two surfaces opposing each other in the thickness direction of the multilayer structure, the first surface is the first principal surface 41 of the mounting substrate 4, and the second surface is the second principal surface 42 of the mounting substrate 4. The wiring structure may be, for example, an interposer. The interposer may be an interposer using a silicon substrate, or may be a substrate constituted of multiple layers.

The first principal surface 41 and the second principal surface 42 of the mounting substrate 4 are separated from each other in the thickness direction D1 of the mounting substrate 4, and intersect the thickness direction D1 of the mounting substrate 4. The first principal surface 41 of the mounting substrate 4 is orthogonal to the thickness direction D1 of the mounting substrate 4, for example, but may include a side surface of a conductor or the like as a surface that is not orthogonal to the thickness direction D1, for example. The second principal surface 42 of the mounting substrate 4 is orthogonal to the thickness direction D1 of the mounting substrate 4, for example, but may include a side surface of a conductor or the like as a surface that is not orthogonal to the thickness direction D1, for example. Furthermore, the first principal surface 41 and the second principal surface 42 of the mounting substrate 4 may have fine irregularities, recessed portions, or projecting portions.

The plurality of external connection terminals included in the high frequency module 100 is disposed on the second principal surface 42 of the mounting substrate 4. The expression "the external connection terminal is disposed on the second principal surface 42 of the mounting substrate 4" includes the external connection terminal being mechanically connected to the second principal surface 42 of the mounting substrate 4 and the external connection terminal being electrically connected to (an appropriate conductor of) the mounting substrate 4. The plurality of external connection terminals includes the first signal terminal 101, the second signal terminal 102, the third signal terminal 103, the fourth signal terminal 104, and the plurality of ground terminals 107. The plurality of ground terminals 107 is electrically connected to the ground conductor 44 of the mounting substrate 4. The ground conductor 44 is a circuit ground of the high frequency module 100. In a plan view from the thickness direction D1 of the mounting substrate 4, each of the first signal terminal 101, the second signal terminal 102, the third signal terminal 103, and the plurality of ground terminals 107 has a quadrangular shape. The thickness of each of the first signal terminal 101, the second signal terminal 102, the third signal terminal 103, the fourth signal terminal 104, and the plurality of ground terminals 107 is smaller than the thickness of the mounting substrate 4. The material of the plurality of external connection terminals is, for example, metal (for example, copper, copper alloy or the like). The external connection terminal may be disposed on the second principal surface 42 of the mounting substrate 4, or may be disposed in such a manner that at least part thereof is buried in the mounting substrate 4.

In the high frequency module 100, as illustrated in FIG. 2, an electronic component E1 including the first acoustic wave filter 10 and the second acoustic wave filter 30 is mounted on the first principal surface 41 of the mounting substrate 4. The expression "the electronic component E1 is mounted on the first principal surface 41 of the mounting substrate 4" includes a situation that the electronic component E1 is disposed on (mechanically connected to) the first principal surface 41 of the mounting substrate 4 and a situation that the electronic component E1 is electrically connected to (an appropriate conductor of) the mounting substrate 4. In the high frequency module 100, the first input/output electrode 15, the second input/output electrode 16, and two ground electrodes 17 and 18 (see FIG. 1) of the first acoustic wave filter 10 are connected to the mounting substrate 4. In the high frequency module 100, the first input/output electrode 35, the second input/output electrode 36, and the ground electrode 37 (see FIG. 1) of the second acoustic wave filter 30 are connected to the mounting substrate 4. Each of the first input/output electrode 15, the second input/output electrode 16, and the two ground electrodes 17 and 18 of the first acoustic wave filter 10 includes a conductive bump. Each of the first input/output electrode 35, the second input/output electrode 36, and the ground electrode 37 of the second acoustic wave filter 30 includes a conductive bump. The material of the conductive bump is, for example, solder, gold, or copper.

Figure 10:
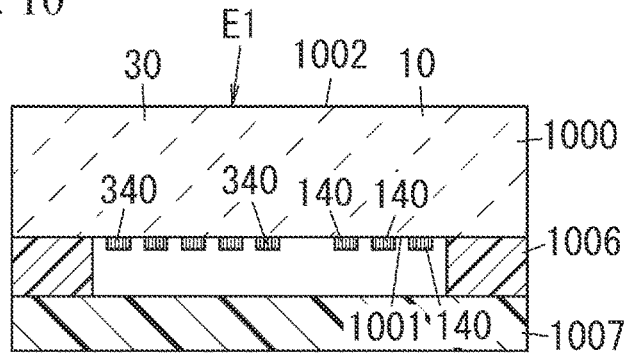
FIG. 10 is a cross-sectional view of an electronic component including a first acoustic wave filter and a second acoustic wave filter in the high frequency module.

For example, as illustrated in FIG. 10, the electronic component E1 includes the first acoustic wave filter 10 and the second acoustic wave filter 30. The first acoustic wave filter 10 includes a first substrate (substrate 1000). The second acoustic wave filter 30 includes a second substrate (substrate 1000). In the electronic component E1, the first substrate and the second substrate are common to each other. In other words, in the electronic component E1, the first substrate and the second substrate are the same substrate 1000. In a plan view from the thickness direction D1 of the mounting substrate 4, the outer edge of the substrate 1000 has a rectangle shape. In the electronic component E1, the first acoustic wave filter 10 and the second acoustic wave filter 30 are arranged in a longitudinal direction of the substrate 1000. In the plan view from the thickness direction D1 of the mounting substrate 4, the outer edge of the electronic component E1 has the same rectangle shape as the outer edge of the substrate 1000. The substrate 1000 has a first principal surface 1001 and a second principal surface 1002 opposing each other in a thickness direction of the substrate 1000 (a direction along the thickness direction D1 of the mounting substrate 4). In the following description, "on the substrate 1000" means "on the first principal surface 1001 of the substrate 1000".

As described above, the first acoustic wave filter 10 is, for example, a π type filter including the plurality of (three) acoustic wave resonators 14 (see FIG. 1).

The first substrate (substrate 1000) is a piezoelectric substrate, and is, for example, a lithium tantalate substrate or a lithium niobate substrate. The first acoustic wave filter 10 includes a plurality of (for example, three) first interdigital transducer (IDT) electrodes 140 provided on the first substrate (substrate 1000). The plurality of first IDT electrodes 140 has conductivity. The material of the plurality of first IDT electrodes 140 is, for example, aluminum (Al), copper (Cu), platinum (Pt), gold (Au), silver (Ag), titanium (Ti), nickel (Ni), chromium (Cr), molybdenum (Mo), tungsten (W), tantalum (Ta), magnesium (Mg), iron (Fe), or an alloy containing any of these metals as a main ingredient. The plurality of first IDT electrodes 140 may have a structure in which a plurality of metal films made of these metals or alloys is laminated. The plurality of first IDT electrodes 140 includes, for example, a laminated film of a first metal film made of a Ti film formed on the substrate 1000 and a second metal film made of an Al film formed on the first metal film. The first metal film has a function as a close contact film. The material of the first metal film is Ti, but is not limited thereto, and may be Cr or NiCr, for example. The material of the second metal film is Al, but is not limited thereto, and may include, for example, Al and Cu. The thickness of the first metal film is thinner than the thickness of the second metal film. In the first acoustic wave filter 10, each of the plurality of first IDT electrodes 140 is a constituent element of the SAW resonator. In the first acoustic wave filter 10, a plurality of first wiring portions connecting the plurality of first IDT electrodes 140 is provided on the first substrate (substrate 1000). In the first acoustic wave filter 10, the series arm path 150, the parallel arm path 151, and the parallel arm path 152 (see FIG. 1) are constituted by the plurality of first wiring portions. In the first acoustic wave filter 10, the plurality of acoustic wave resonators 14 is connected by connecting the plurality of first IDT electrodes 140. In the first acoustic wave filter 10, the first input/output electrode 15, the second input/output electrode 16, and the two ground electrodes 17 and 18 are provided on the first substrate (substrate 1000).

As described above, the second acoustic wave filter 30 is, for example, a ladder filter including the plurality of (ten) acoustic wave resonators 34 (see FIG. 1).

The second substrate (substrate 1000) is a piezoelectric substrate, and is, for example, a lithium tantalate substrate or a lithium niobate substrate. The second acoustic wave filter 30 includes a plurality of (for example, ten) second IDT electrodes 340 provided on the second substrate (substrate 1000). The material of the plurality of second IDT electrodes 340 is the same as the material of the plurality of first IDT electrodes 140. In the second acoustic wave filter 30, each of the plurality of second IDT electrodes 340 is a constituent element of the SAW resonator. In the second acoustic wave filter 30, a plurality of second wiring portions connecting the plurality of second IDT electrodes 340 is provided on the second substrate (substrate 1000). In the second acoustic wave filter 30, the series arm path 350 and five parallel arm paths 351 to 355 (see FIG. 1) are constituted by the plurality of second wiring portions. In the second acoustic wave filter 30, the plurality of acoustic wave resonators 34 is connected by connecting the plurality of second IDT electrodes 340. In the second acoustic wave filter 30, the first input/output electrode 35, the second input/output electrode 36, and the ground electrode 37 are provided on the second substrate (substrate 1000).

The first acoustic wave filter 10 is disposed on the first principal surface 41 of the mounting substrate 4 in such a manner that the plurality of first IDT electrodes 140 is located on the mounting substrate 4 side when viewed from the first substrate. The second acoustic wave filter 30 is disposed on the first principal surface 41 of the mounting substrate 4 in such a manner that the plurality of second IDT electrodes 340 is located on the mounting substrate 4 side when viewed from the second substrate.

The first acoustic wave filter 10 further includes constituent elements of a first package. The constituent elements of the first package include, for example, a first spacer layer (spacer layer 1006), a first cover member (cover member 1007), and a plurality of first external terminals (the first input/output electrode 15, second input/output electrode 16, and two ground electrodes 17 and 18). The first spacer layer is provided on the first substrate. The first spacer layer includes a portion formed along the outer edge of the first substrate in a plan view from a thickness direction of the first substrate. The first spacer layer has an electrical insulation property. The material of the first spacer layer is epoxy resin, polyimide, or the like. The first cover member has a flat plate shape. The first cover member is disposed on the first spacer layer to face the first substrate in the thickness direction of the first substrate. The first cover member overlaps with the plurality of first IDT electrodes 140 in the thickness direction of the first substrate, and is separated from the plurality of first IDT electrodes 140 in the thickness direction of the first substrate. The first cover member has an electrical insulation property. The material of the first cover member is epoxy resin, polyimide, or the like. The plurality of first external terminals is exposed from the first cover member.

The second acoustic wave filter 30 further includes constituent elements of a second package. The constituent elements of the second package include, for example, a second spacer layer (spacer layer 1006), a second cover member (cover member 1007), and a plurality of second external terminals (the first input/output electrode 35, second input/output electrode 36, and ground electrode 37). The second spacer layer is provided on the second substrate. The second spacer layer includes a portion formed along the outer edge of the second substrate in a plan view from a thickness direction of the second substrate. The second spacer layer has an electrical insulation property. The material of the second spacer layer is epoxy resin, polyimide, or the like. The second cover member has a flat plate shape. The second cover member is disposed on the second spacer layer to face the second substrate in the thickness direction of the second substrate. The second cover member overlaps with the plurality of second IDT electrodes 340 in the thickness direction of the second substrate, and is separated from the plurality of second IDT electrodes 340 in the thickness direction of the second substrate. The second cover member has an electrical insulation property. The material of the second cover member is epoxy resin, polyimide, or the like. The plurality of second external terminals is exposed from the second cover member.

In the electronic component E1, the first spacer layer and the second spacer layer are common to each other. In other words, in the electronic component E1, the first spacer layer and the second spacer layer are the same spacer layer 1006. In the electronic component E1, the first cover member and the second cover member are the same cover member 1007. In the first acoustic wave filter 10, the first input/output electrode 15, the second input/output electrode 16, and the two ground electrodes 17 and 18 each includes a via electrode passing through the spacer layer 1006 and the cover member 1007, and a conductive bump on the via electrode. In the second acoustic wave filter 30, the first input/output electrode 35, the second input/output electrode 36, and the ground electrode 37 each includes a via electrode passing through the spacer layer 1006 and the cover member 1007, and a conductive bump on the via electrode.

The first substrate and the second substrate described above are not limited to piezoelectric substrates, and may be, for example, laminated substrates each including a silicon substrate, a low acoustic velocity film provided on the silicon substrate, and a piezoelectric layer provided on the low acoustic velocity film. The material of the piezoelectric layer is, for example, lithium niobate or lithium tantalate. The low acoustic velocity film is a film in which the acoustic velocity of a bulk wave propagating through the low acoustic velocity film is lower than the acoustic velocity of a bulk wave propagating through the piezoelectric layer. The material of the low acoustic velocity film is, for example, silicon oxide. The material of the low acoustic velocity film is not limited to silicon oxide. The material of the low acoustic velocity film may be, for example, silicon oxide, glass, silicon oxynitride, tantalum oxide, a compound obtained by adding fluorine, carbon, or boron to silicon oxide, or a material containing each of the above materials as a main ingredient. In the silicon substrate, the acoustic velocity of a bulk wave propagating through the silicon substrate is higher than the acoustic velocity of an acoustic wave propagating through the piezoelectric layer. In this case, the bulk wave propagating through the silicon substrate is a bulk wave having the lowest acoustic velocity among a plurality of the bulk waves propagating through the silicon substrate.

The laminated substrate may further include a high acoustic velocity film provided between the silicon substrate and the low acoustic velocity film. The high acoustic velocity film is a film in which the acoustic velocity of a bulk wave propagating through the high acoustic velocity film is higher than the acoustic velocity of the acoustic wave propagating through the piezoelectric layer. The material of the high acoustic velocity film is, for example, at least one material selected from the group consisting of diamond-like carbon, aluminum nitride, aluminum oxide, silicon carbide, silicon nitride, silicon, sapphire, a piezoelectric body (lithium tantalate, lithium niobate, or quartz), alumina, zirconia, cordierite, mullite, steatite, forsterite, magnesia, and diamond. The material of the high acoustic velocity film may be a material containing any of the materials described above as a main ingredient, or a material including, as a main ingredient, a mixture containing any of the materials described above.

The laminated substrate may include, for example, a close contact layer interposed between the low acoustic velocity film and the piezoelectric layer. The close contact layer is made of, for example, resin (epoxy resin, polyimide resin). Further, the laminated substrate may include a dielectric film between the low acoustic velocity film and the piezoelectric layer, on the piezoelectric layer, or under the low acoustic velocity film.

In the high frequency module 100, a plurality of the electronic components is mounted on the first principal surface 41 of the mounting substrate 4. The plurality of electronic components includes the above-described electronic component E1, the plurality of first inductors L11, L12, and L13, and the second inductor L21. The expression "the electronic component is mounted on the first principal surface 41 of the mounting substrate 4" includes a situation that the electronic component is disposed on (mechanically connected to) the first principal surface 41 of the mounting substrate 4 and a situation that the electronic component is electrically connected to (an appropriate conductor of) the mounting substrate 4. In the high frequency module 100, the inductor L22 is incorporated in the mounting substrate 4. In the high frequency module 100, the plurality of first capacitors C11, C12, C13, and C14 and the plurality of second capacitors C21, C22, and C23 are incorporated in the mounting substrate 4. In the high frequency module 100, the capacitor C2 is incorporated in the mounting substrate 4.

Each of the plurality of first inductors L11, L12, and L13 is, for example, a chip inductor. In a plan view from the thickness direction D1 of the mounting substrate 4, the outer edge of each of the plurality of first inductors L11, L12, and L13 has a rectangle shape.

The second inductor L21 is, for example, a chip inductor. In a plan view from the thickness direction D1 of the mounting substrate 4, the outer edge of the second inductor L21 has a rectangle shape.

The second inductor L22 is a circuit element including a conductor pattern portion 48 formed in the mounting substrate 4. For example, as illustrated in FIGS. 6 to 8 and 9A to 9D, the second inductor L22 is a spiral inductor including a plurality (for example, four) of the conductor pattern portions 48 and a plurality of (for example, three) via conductors 49 (see FIGS. 9A to 9C). In the second inductor L22, the plurality of conductor pattern portions 48 and the plurality of via conductors 49 are alternately arranged one by one in the thickness direction D1 of the mounting substrate 4, and one ends of two conductor pattern portions 48 adjacent to each other in the thickness direction D1 of the mounting substrate 4 are connected to each other through one via conductor 49. Hereinafter, for convenience of explanation, the plurality of conductor pattern portions 48 may be referred to as a first conductor pattern portion 481, a second conductor pattern portion 482, a third conductor pattern portion 483, and a fourth conductor pattern portion 484 in the order of closeness to the second principal surface 42 of the mounting substrate 4 in the thickness direction D1 of the mounting substrate 4. The plurality of via conductors 49 may be referred to as a first via conductor 491, a second via conductor 492, and a third via conductor 493 in the order of closeness to the second principal surface 42 of the mounting substrate 4 in the thickness direction D1 of the mounting substrate 4. The first via conductor 491 connects the first conductor pattern portion 481 and the second conductor pattern portion 482. The second via conductor 492 connects the second conductor pattern portion 482 and the third conductor pattern portion 483. The third via conductor 493 connects the third conductor pattern portion 483 and the fourth conductor pattern portion 484. In the second inductor L22, the fourth conductor pattern portion 484 is connected to a conductor pattern portion constituting the second capacitor C23 (see FIG. 1) incorporated in the mounting substrate 4 through a via conductor, and the first conductor pattern portion 481 is connected to the third signal terminal 103 through a via conductor. In a plan view from the thickness direction D1 of the mounting substrate 4, the second inductor L22 has, for example, a rectangular frame shape, but the shape thereof is not limited to a rectangular frame shape. A winding axis F1 (see FIG. 8 and FIGS. 9A to 9D) of the second inductor L22 extends along the thickness direction D1 of the mounting substrate 4. The winding axis F1 of the second inductor L22 is a virtual center axis of the second inductor L22. The winding axis F1 of the inductor L22 and the thickness direction D1 of the mounting substrate 4 are parallel to each other, but are not limited to being strictly parallel to each other, and it is sufficient that an angle formed by the winding axis F1 and the thickness direction D1 of the mounting substrate 4 is not greater than 10 degrees.

Each of the plurality of first capacitors C11, C12, C13 and C14, and the plurality of second capacitors C21, C22, and C23 includes a pair of conductor pattern portions 45, 45 (see FIG. 6) facing each other in the thickness direction D1 of the mounting substrate 4.

As illustrated in FIGS. 6 and 7, the resin layer 5 is disposed on the first principal surface 41 of the mounting substrate 4. The resin layer 5 contains resin (for example, epoxy resin). The resin layer 5 may contain a filler in addition to the resin.

The resin layer 5 covers the electronic component E1, the plurality of first inductors L11, L12, and L13, and the second inductor L21. That is, the resin layer 5 covers the outer peripheral surface of each of the plurality of electronic components, and the principal surface on the opposite side to the mounting substrate 4 side of each of the plurality of electronic components. The outer peripheral surface of each of the plurality of electronic components includes four side surfaces connecting a first principal surface on the mounting substrate 4 side and a second principal surface on the opposite side to the mounting substrate 4 side of the electronic component.

The metal electrode layer 6 covers the resin layer 5 and is connected to the ground terminal 107. The metal electrode layer 6 has conductivity. In the high frequency module 100, the metal electrode layer 6 is a shield layer provided for electromagnetic shielding inside and outside the high frequency module 100. The metal electrode layer 6 is formed to have a multilayer structure in which a plurality of metal layers is laminated, but is not limited thereto, and may be a single metal layer. The metal layer contains one or a plurality of types of metals. In the case where the metal electrode layer 6 has a multilayer structure in which a plurality of metal layers is laminated, the metal electrode layer 6 includes, for example, a first stainless steel layer, a Cu layer on the first stainless steel layer, and a second stainless steel layer on the Cu layer. The material of each of the first stainless steel layer and the second stainless steel layer is an alloy containing Fe, Ni, and Cr. When the metal electrode layer 6 is a single metal layer, it is, for example, a Cu layer. The metal electrode layer 6 includes a first conductor 61 and a second conductor 62. The first conductor 61 covers a principal surface 51 on the opposite side to the mounting substrate 4 side of the resin layer 5. The second conductor 62 covers an outer peripheral surface 53 of the resin layer 5 and the outer peripheral surface 43 of the mounting substrate 4. The outer peripheral surface 43 of the mounting substrate 4 includes four side surfaces connecting the first principal surface 41 and the second principal surface 42 of the mounting substrate 4. The metal electrode layer 6 is in contact with part of an outer peripheral surface of the ground conductor 44 (see FIG. 5) included in the mounting substrate 4. The ground conductor 44 is connected to the ground terminal 107. In the high frequency module 100, when the mounting substrate 4 includes a second ground conductor connected to the ground conductor 44 (hereinafter, also referred to as the first ground conductor 44), it is sufficient that at least one ground conductor of the first ground conductor 44 and the second ground conductor is in contact with the metal electrode layer 6.

2.4. Layout of High Frequency Module

In the high frequency module 100, as illustrated in FIG. 2, each of the plurality of first inductors L11, L12, and L13 and the second inductor L21 is a chip inductor (surface-mount inductor), and is disposed on the first principal surface 41 of the mounting substrate 4. In the high frequency module 100, the second inductor L22 is a circuit element including the conductor pattern portion 48 formed in the mounting substrate 4, as illustrated in FIGS. 6 and 7.

In the high frequency module 100, as illustrated in FIG. 2, the plurality of first inductors L11, L12, and L13 is adjacent to the first acoustic wave filter 10 on the first principal surface 41 of the mounting substrate 4. The expression "the plurality of first inductors L11, L12, and L13 is adjacent to the first acoustic wave filter 10" means that there are no other electronic components between each of the plurality of first inductors L11, L12, and L13 and the first acoustic wave filter 10 on the first principal surface 41 of the mounting substrate 4, and each of the plurality of first inductors L11, L12, and L13 and the first acoustic wave filter 10 are adjacent to each other.

As described above, the mounting substrate 4 has a rectangular shape in a plan view from the thickness direction D1 of the mounting substrate 4. As illustrated in FIG. 3, the first signal terminal 101, the second signal terminal 102, the third signal terminal 103, and the fourth signal terminal 104 are disposed in a first corner 421, a second corner 422, a third corner 423, and a fourth corner 424, respectively, of the second principal surface 42 of the mounting substrate 4.

As illustrated in FIG. 2, the first capacitor C14 overlaps with the second signal terminal 102 in a plan view from the thickness direction D1 of the mounting substrate 4. In the high frequency module 100, part of the first capacitor C14 overlaps with part of the second signal terminal 102 in the plan view from the thickness direction D1 of the mounting substrate 4, but the present disclosure is not limited thereto. For example, the entire first capacitor C14 may overlap with part of the second signal terminal 102, the entire first capacitor C14 may overlap with the entire second signal terminal 102, or part of the first capacitor C14 may overlap with the entire second signal terminal 102. In the plan view from the thickness direction D1 of the mounting substrate 4, the second inductor L22 overlaps with the third signal terminal 103. In the high frequency module 100, part of the second inductor L22 overlaps with part of the third signal terminal 103 in the plan view from the thickness direction D1 of the mounting substrate 4, but the present disclosure is not limited thereto. For example, the entire second inductor L22 may overlap with part of the third signal terminal 103.

As illustrated in FIG. 5, in the high frequency module 100, the first signal terminal 101, the second signal terminal 102, the third signal terminal 103, and the fourth signal terminal 104 do not overlap with the ground conductor 44 in a plan view from the thickness direction D1 of the mounting substrate 4.

In the high frequency module 100, the shortest distance between the outer peripheral surface 43 of the mounting substrate 4 and the third signal terminal 103 connected to the circuit element (second inductor L22) is longer than the shortest distance between the outer peripheral surface 43 of the mounting substrate 4 and the circuit element (second inductor L22). This point will be described in more detail below.

As illustrated in FIG. 4, the first signal terminal 101, the second signal terminal 102, the third signal terminal 103, and the fourth signal terminal 104 have a rectangular shape in a plan view from the thickness direction D1 of the mounting substrate 4. In the plan view from the thickness direction D1 of the mounting substrate 4, an outer edge 1030 of the third signal terminal 103 includes a first side 1031 adjacent to the outer edge 432 of the second principal surface 42 of the mounting substrate 4 in a first direction D11, and a second side 1032 adjacent to the outer edge 432 of the second principal surface 42 of the mounting substrate 4 in a second direction D12 orthogonal to the first direction D11. The first direction D11 is a direction along a first side (long side) of the outer edge 430 of the first principal surface 41 of the mounting substrate 4 in the plan view from the thickness direction D1 of the mounting substrate 4. The second direction D12 is a direction along a second side (short side) of the outer edge 430 of the first principal surface 41 of the mounting substrate 4 in the plan view from the thickness direction D1 of the mounting substrate 4. The first direction D11 and the second direction D12 are directions orthogonal to each other. Each of the first direction D11 and the second direction D12 is a direction orthogonal to the thickness direction D1 of the mounting substrate 4. In the first direction D11, a shortest distance W31 between the first side 1031 of the outer edge 1030 of the third signal terminal 103 and the outer peripheral surface 43 of the mounting substrate 4 is longer than a shortest distance W11 between the outer peripheral surface 43 of the mounting substrate 4 and the second inductor L22. In the second direction D12, a shortest distance W32 between the second side 1032 of the outer edges 1030 of the third signal terminal 103 and the outer peripheral surface 43 of the mounting substrate 4 is longer than a shortest distance W12 between the outer peripheral surface 43 of the mounting substrate 4 and the second inductor L22.

Figure 9A:
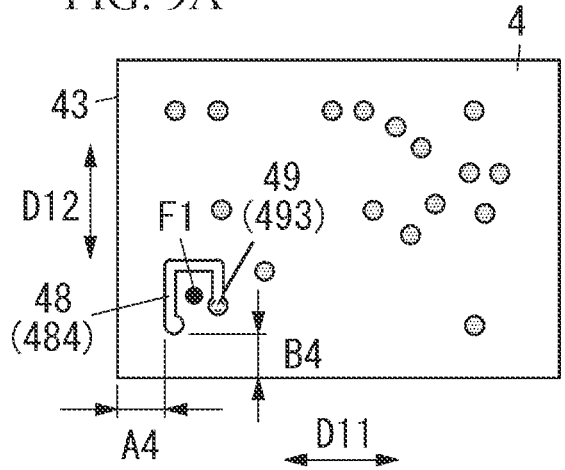
FIG. 9A is a cross-sectional view in which a circuit element disposed in the mounting substrate includes a conductor pattern portion closest to a first principal surface of the mounting substrate regarding the high frequency module.
Figure 9D:
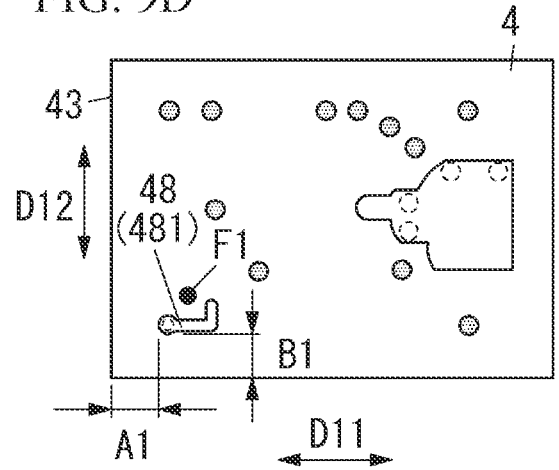
FIG. 9D is a cross-sectional view in which a circuit element disposed in the mounting substrate includes a conductor pattern portion fourth closest to the first principal surface of the mounting substrate regarding the high frequency module.
Figure 9B:
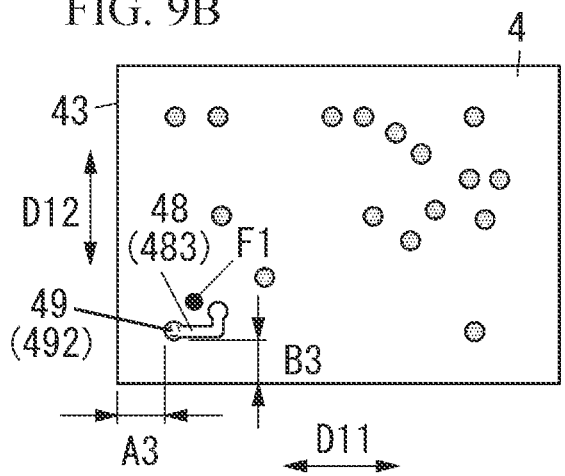
FIG. 9B is a cross-sectional view in which a circuit element disposed in the mounting substrate includes a conductor pattern portion second closest to the first principal surface of the mounting substrate regarding the high frequency module.
Figure 9E:
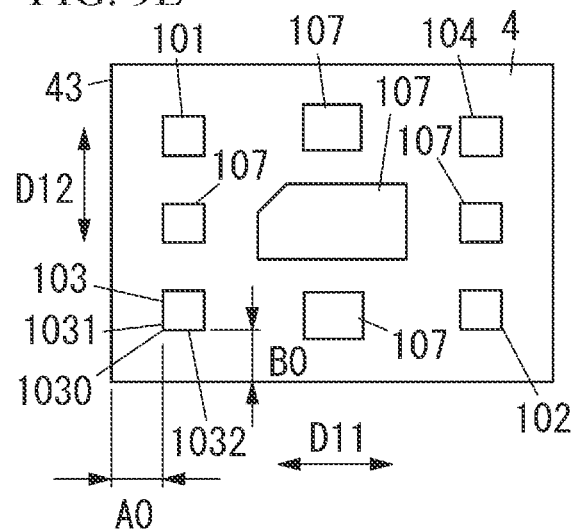
FIG. 9E is a cross-sectional view in which the mounting substrate includes first, second, third, and fourth signal terminals regarding the high frequency module.
Figure 9C:
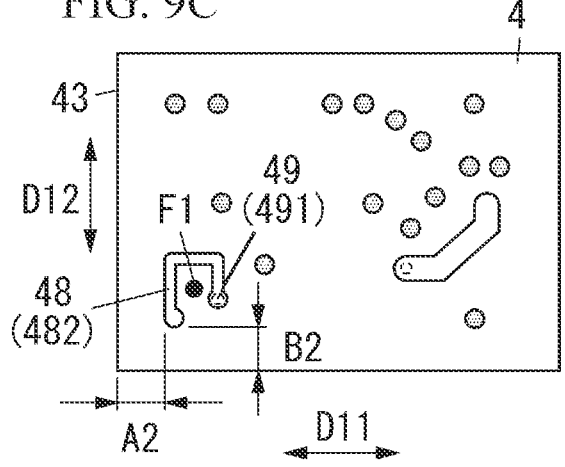
FIG. 9C is a cross-sectional view in which a circuit element disposed in the mounting substrate includes a conductor pattern portion third closest to the first principal surface of the mounting substrate regarding the high frequency module.

In the high frequency module 100, the shortest distance W31 (see FIG. 4) is the same as a distance A0 between the third signal terminal 103 and the outer peripheral surface 43 of the mounting substrate 4 in the first direction D11 (see FIG. 9E). The distance A0 is the shortest distance between the third signal terminal 103 and the outer peripheral surface 43 of the mounting substrate 4 in the first direction D11. In the high frequency module 100, the shortest distance W11 (see FIG. 4) is the shortest distance among a distance A1 (see FIG. 9D), a distance A2 (see FIG. 9C), a distance A3 (see FIG. 9B), and a distance A4 (see FIG. 9A). The distance A1 is the shortest distance between the first conductor pattern portion 481 and the outer peripheral surface 43 of the mounting substrate 4 in the first direction D11. The distance A2 is the shortest distance between the second conductor pattern portion 482 and the outer peripheral surface 43 of the mounting substrate 4 in the first direction D11. The distance A3 is the shortest distance between the third conductor pattern portion 483 and the outer peripheral surface 43 of the mounting substrate 4 in the first direction D11. The distance A4 is the shortest distance between the fourth conductor pattern portion 484 and the outer peripheral surface 43 of the mounting substrate 4 in the first direction D11. Therefore, the high frequency module 100 satisfies the following conditions: distance A0>distance A1, distance A0>distance A2, distance A0>distance A3, and distance A0>distance A4. The distances A1, A2, A3, and A4 have the same value, but are not limited thereto, and may have different values from each other as long as the above-described conditions are satisfied. In the high frequency module 100, the second conductor 62 of the metal electrode layer 6 extends from the outer edge 430 of the first principal surface 41 of the mounting substrate 4 to the outer edge 432 of the second principal surface 42 of the mounting substrate 4 (see FIGS. 6 and 7). Accordingly, each of the distances A1, A2, A3, and A4 between each of the first, second, third, and fourth conductor pattern portions 481, 482, 483 and 484, and the outer peripheral surface 43 of the mounting substrate 4 is the same as the shortest distance between each of the first, second, third, and fourth conductor pattern portions 481, 482, 483 and 484, and the metal electrode layer 6 in the first direction D11. In the high frequency module 100, the shortest distance A0 between the third signal terminal 103 and the outer peripheral surface 43 of the mounting substrate 4 in the first direction D11 is the same as the shortest distance between the third signal terminal 103 and the metal electrode layer 6 in the first direction D11.

In the high frequency module 100, the shortest distance W32 (see FIG. 4) is the same as a distance B0 (see FIG. 9E) between the third signal terminal 103 and the outer peripheral surface 43 of the mounting substrate 4 in the second direction D12. The distance B0 is the shortest distance between the third signal terminal 103 and the outer peripheral surface 43 of the mounting substrate 4 in the second direction D12. In the high frequency module 100, the shortest distance W12 (see FIG. 4) is the shortest distance among a distance B1 (see FIG. 9D), a distance B2 (see FIG. 9C), a distance B3 (see FIG. 9B), and a distance B4 (see FIG. 9A). The distance B1 is the shortest distance between the first conductor pattern portion 481 and the outer peripheral surface 43 of the mounting substrate 4 in the second direction D12. The distance B2 is the shortest distance between the second conductor pattern portion 482 and the outer peripheral surface 43 of the mounting substrate 4 in the second direction D12. The distance B3 is the shortest distance between the third conductor pattern portion 483 and the outer peripheral surface 43 of the mounting substrate 4 in the second direction D12. The distance B4 is the shortest distance between the fourth conductor pattern portion 484 and the outer peripheral surface 43 of the mounting substrate 4 in the second direction D12. Therefore, the high frequency module 100 satisfies the following conditions: distance B0>distance B1, distance B0>distance B2, distance B0>distance B3, and distance B0>distance B4. The distances B1, B2, B3, and B4 have the same value, but are not limited thereto, and may have different values from each other as long as the above-described conditions are satisfied. In the high frequency module 100, the second conductor 62 of the metal electrode layer 6 extends from the outer edge 430 of the first principal surface 41 of the mounting substrate 4 to the outer edge 432 of the second principal surface 42 of the mounting substrate 4 (see FIGS. 6 and 7). Accordingly, each of the distances B1, B2, B3, and B4 between each of the first, second, third, and fourth conductor pattern portions 481, 482, 483 and 484, and the outer peripheral surface 43 of the mounting substrate 4 is the same as the shortest distance between each of the first, second, third, and fourth conductor pattern portions 481, 482, 483 and 484, and the metal electrode layer 6 in the second direction D12. In the high frequency module 100, the shortest distance B0 between the third signal terminal 103 and the outer peripheral surface 43 of the mounting substrate 4 in the second direction D12 is the same as the shortest distance between the third signal terminal 103 and the metal electrode layer 6 in the second direction D12.

In the high frequency module 100, the shortest distances W31 and W32 have the same value, but the disclosure is not limited thereto, and the shortest distances W31 and W32 may have different values. In the case where the shortest distances W31 and W32 are different from each other, the shortest distance between the outer peripheral surface 43 of the mounting substrate 4 and the third signal terminal 103 connected to the circuit element (second inductor L22) takes the smaller value of the shortest distances W31 and W32.

3. Effects

3.1. High Frequency Module

The high frequency module 100 according to Embodiment 1 includes the mounting substrate 4, the first signal terminal 101, the second signal terminal 102, the third signal terminal 103, the ground terminal 107, the first filter 1, and the second filter 2. The mounting substrate 4 has the first principal surface 41 and the second principal surface 42 opposing each other. The first signal terminal 101, the second signal terminal 102, the third signal terminal 103, and the ground terminal 107 are disposed on the second principal surface 42 of the mounting substrate 4. The first filter 1 is connected between the first signal terminal 101 and the second signal terminal 102. The first filter 1 is the hybrid filter 1 including the acoustic wave filter 10, the plurality of first inductors L11, L12 and L13, and the plurality of first capacitors C11, C12, C13, and C14. The acoustic wave filter 10 includes at least one acoustic wave resonator 14. The second filter 2 is connected between the first signal terminal 101 and the third signal terminal 103. The second filter 2 includes the plurality of second inductors L21 and L22 and the plurality of second capacitors C21, C22, and C23. The pass band width of the hybrid filter 1 is larger than the pass band width of the acoustic wave resonator 14. The acoustic wave filter 10 is mounted on the first principal surface 41 of the mounting substrate 4. The plurality of first inductors L11, L12, and L13, the plurality of first capacitors C11, C12, C13, and C14, the plurality of second inductors L21 and L22, and the plurality of second capacitors C21, C22, and C23 are disposed in or on the mounting substrate 4. The high frequency module 100 further includes the resin layer 5 and the metal electrode layer 6. The resin layer 5 is disposed on the first principal surface 41 of the mounting substrate 4 and covers the acoustic wave filter 10. The metal electrode layer 6 covers the resin layer 5 and the outer peripheral surface 43 of the mounting substrate 4. The metal electrode layer 6 is connected to the ground terminal 107. At least one inductor (the second inductor L22) among a plurality of inductors including the plurality of first inductors L11, L12, and L13 and the plurality of second inductors L21 and L22 is a circuit element including the conductor pattern portion 48 formed in the mounting substrate 4. The shortest distance between the outer peripheral surface 43 of the mounting substrate 4 and the third signal terminal 103 connected to the circuit element (second inductor L22) is longer than the shortest distance between the outer peripheral surface 43 of the mounting substrate 4 and the circuit element.

The high frequency module 100 according to Embodiment 1 may suppress the degradation in characteristics of the hybrid filter 1. More specifically, in the high frequency module 100, the shortest distance between the outer peripheral surface 43 of the mounting substrate 4 and the third signal terminal 103 connected to the circuit element (second inductor L22) is longer than the shortest distance between the outer peripheral surface 43 of the mounting substrate 4 and the circuit element (second inductor L22). This makes it possible for the high frequency module 100 to suppress the degradation in characteristics of the second filter 2 caused by the parasitic capacitance generated between the metal electrode layer 6 and the third signal terminal 103 connected to the second inductor L22 of the second filter 2. With this, for example, the high frequency module 100 may suppress the degradation in characteristics of the hybrid filter 1 connected to the first signal terminal 101 together with the second filter 2.

Figure 12:
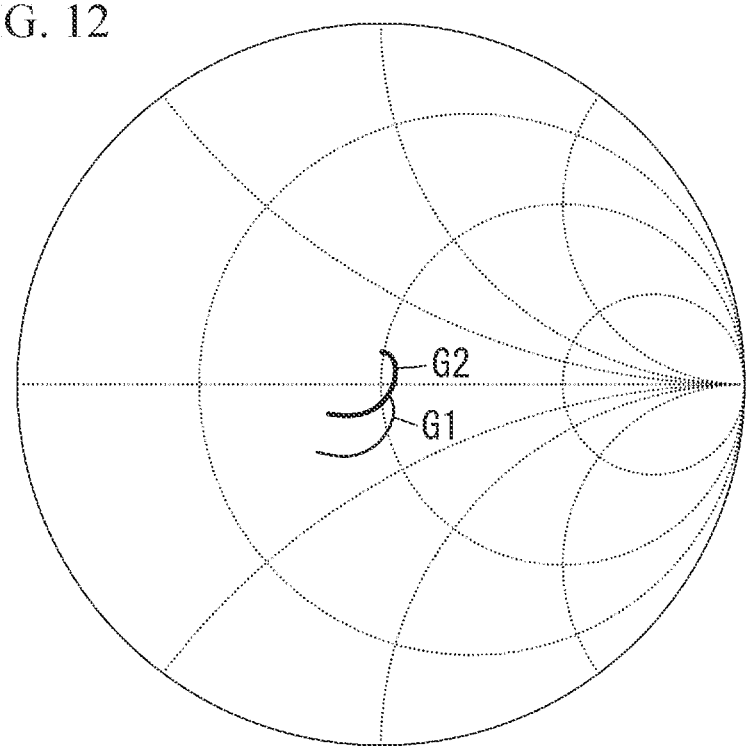
FIG. 12 is a Smith chart depicting frequency characteristics of impedance of a second filter in the above-mentioned high frequency module and frequency characteristics of impedance of a second filter in a high frequency module of a comparative example.

For example, the hybrid filter 1 is designed such that the impedance of the hybrid filter 1 in the pass band of the hybrid filter 1 is close to the characteristic impedance (for example, 50Ω). FIG. 12 is a Smith chart depicting frequency characteristics of impedance of the second filter 2 in the high frequency module 100 according to Embodiment 1 and frequency characteristics of impedance of a second filter in a high frequency module of a comparative example. In the high frequency module of the comparative example, the shortest distance between the third signal terminal and the outer peripheral surface of the mounting substrate is shorter than the shortest distance between the second inductor and the outer peripheral surface of the mounting substrate, and a parasitic capacitance of 0.2 pF is generated between the third signal terminal and the metal electrode layer. In FIG. 12, frequency characteristics indicated by a solid line G1 represent the frequency characteristics of the impedance of the high frequency module of the comparative example. In the high frequency module of the comparative example, the impedance of the second filter 2 is shifted from the position of the characteristic impedance on the Smith chart in such a manner that the capacitive reactance increases. In contrast, in FIG. 12, frequency characteristics indicated by a bold line G2 represent the frequency characteristics of the impedance when the generation of parasitic capacitance between the third signal terminal 103 and the metal electrode layer 6 is suppressed by the configuration of the high frequency module 100 according to Embodiment 1. As can be understood from FIG. 12, the high frequency module 100 according Embodiment 1 may suppress impedance mismatching of the second filter 2. Thus, the high frequency module 100 according to Embodiment 1 may suppress the degradation in characteristics of the second filter 2, thereby making it possible to suppress the degradation in characteristics of the hybrid filter 1.

Figure 13:
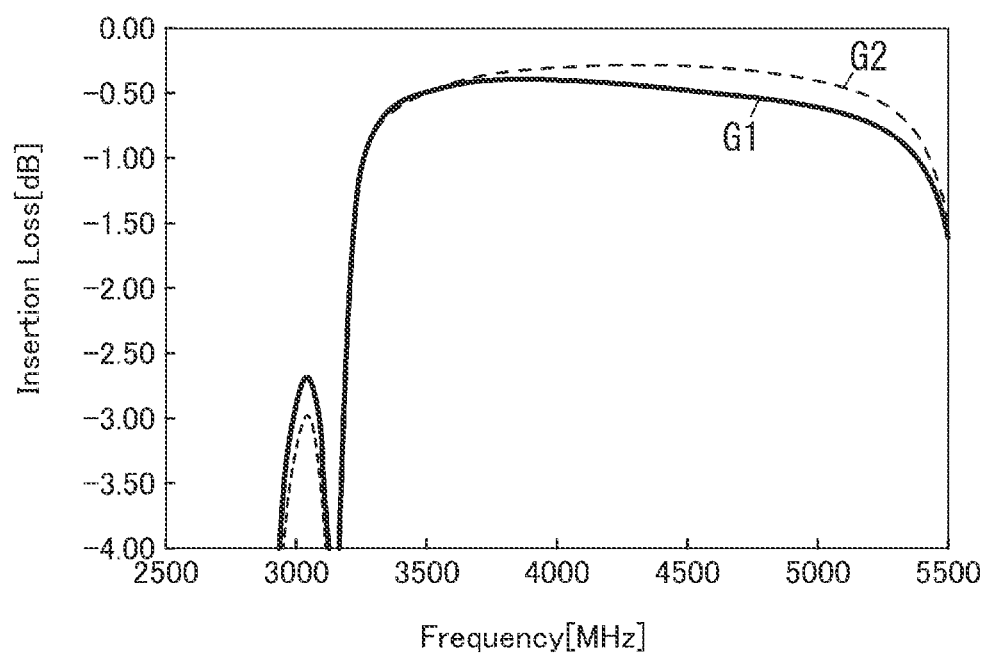
FIG. 13 is a diagram depicting frequency characteristics of insertion loss of a second filter in the above-mentioned high frequency module and frequency characteristics of insertion loss of a second filter in a high frequency module of a comparative example.
Figure 14:
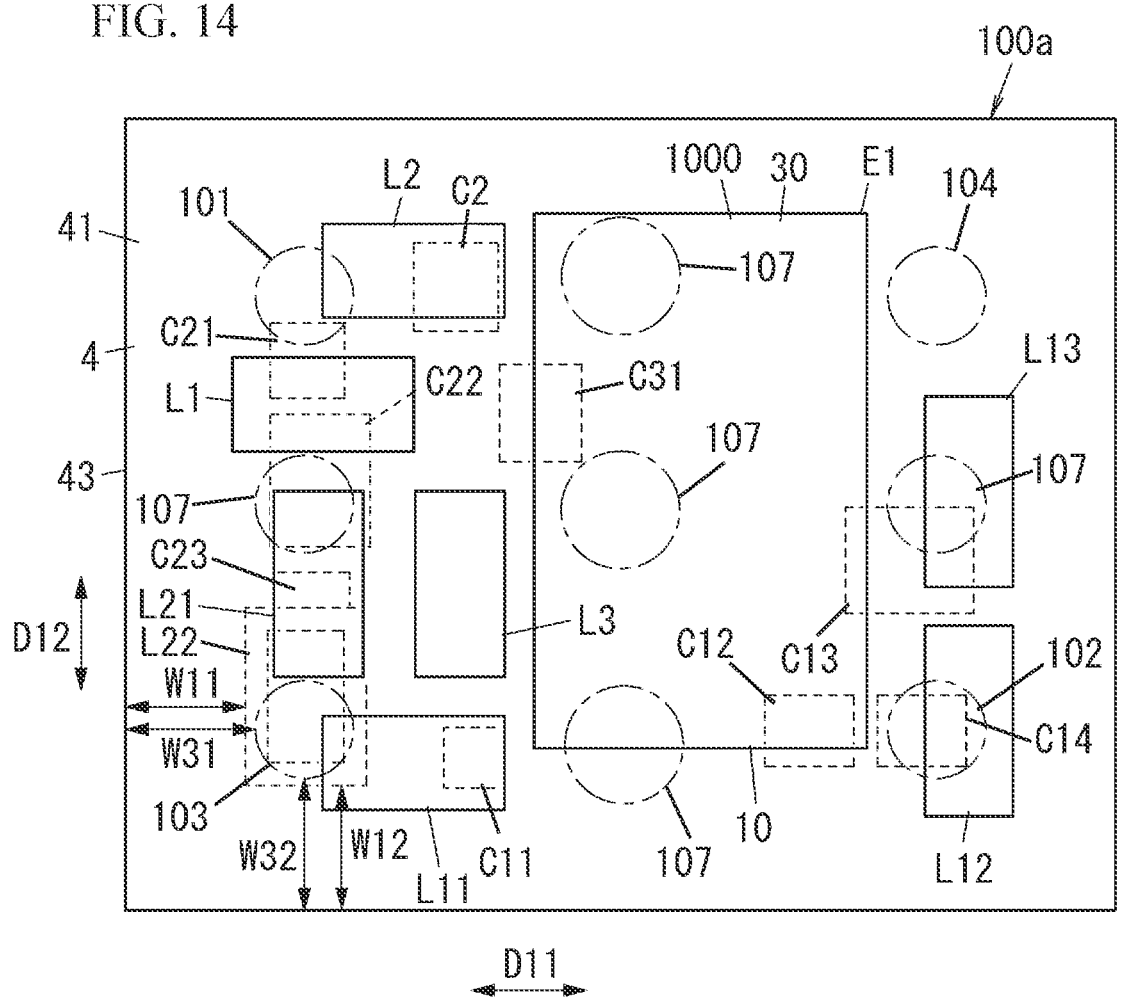
FIG. 14 is a plan view of a high frequency module according to Embodiment 2.
Figure 15:
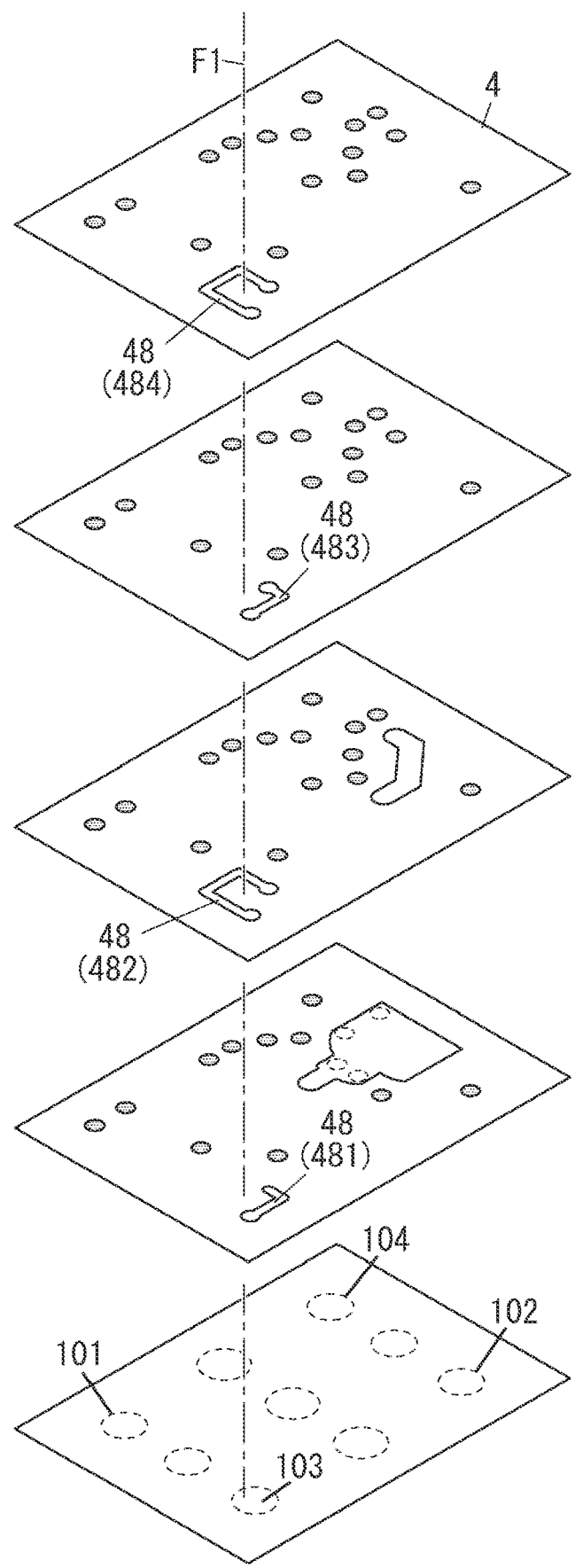
FIG. 15 is a perspective view of a mounting substrate and a circuit element in the high frequency module.

FIG. 13 is a diagram depicting frequency characteristics of insertion loss of the second filter 2 in the high frequency module 100 according to Embodiment 1 and frequency characteristics of insertion loss of the second filter in the high frequency module of the comparative example. As can be understood from FIG. 13, in the high frequency module 100 according to Embodiment 1 (shown as a broken line G2), the insertion loss may be reduced as compared with the high frequency module of the comparative example (shown as a solid line G1). Thus, the high frequency module 100 according to Embodiment 1 may suppress the degradation in characteristics of the second filter 2, thereby making it possible to suppress the degradation in characteristics of the hybrid filter 1.

The high frequency module 100 further includes the fourth signal terminal 104 and the third filter 3. The fourth signal terminal 104 is disposed on the second principal surface 42 of the mounting substrate 4. The third filter 3 is connected between the first signal terminal 101 and the fourth signal terminal 104. The mounting substrate 4 has a rectangular shape in a plan view from the thickness direction D1 of the mounting substrate 4. The first signal terminal 101, the second signal terminal 102, the third signal terminal 103, and the fourth signal terminal 104 are disposed in the first corner 421, the second corner 422, the third corner 423, and the fourth corner 424, respectively, of the second principal surface 42 of the mounting substrate 4. This makes it possible for the high frequency module 100 to improve the isolation between the first filter 1 and the second filter 2, the isolation between the first filter 1 and the third filter 3, and the isolation between the second filter 2 and the third filter 3.

In the high frequency module 100 according to Embodiment 1, the mounting substrate 4 includes the ground conductor 44. The ground conductor 44 is disposed between the first principal surface 41 and the second principal surface 42 of the mounting substrate 4, and is connected to the ground terminal 107. The first signal terminal 101, the second signal terminal 102, the third signal terminal 103, and the fourth signal terminal 104 do not overlap with the ground conductor 44 in a plan view from the thickness direction D1 of the mounting substrate 4. Thus, the high frequency module 100 may reduce parasitic capacitance generated between the ground conductor 44 and each of the first signal terminal 101, the second signal terminal 102, the third signal terminal 103, and the fourth signal terminal 104.

3.2. Communication Apparatus

The communication apparatus 300 according to Embodiment 1 includes the high frequency module 100 and the signal processing circuit 301 connected to the high frequency module 100. Thus, the communication apparatus 300 may suppress the degradation in the characteristics of the hybrid filter 1.

Embodiment 2

A high frequency module 100a according to Embodiment 2 will be described with reference to FIGS. 14, 15, and 16A to 16E. As for the high frequency module 100a according to Embodiment 2, the same constituent elements as those of the high frequency module 100 according to Embodiment 1 are denoted by the same reference signs, and the description thereof will be omitted. The circuit configuration of the high frequency module 100a is the same as the circuit configuration of the high frequency module 100 according to Embodiment 1 having been described with reference to FIG. 1.

The high frequency module 100a according to Embodiment 2 is different from the high frequency module 100 according to Embodiment 1 in that each of a first signal terminal 101, a second signal terminal 102, a third signal terminal 103, a fourth signal terminal 104, and a plurality of ground terminals 107 has a circular shape in a plan view from a thickness direction D1 of a mounting substrate 4.

In a first direction D11, a shortest distance W31 between an outer edge 1030 of the third signal terminal 103 and an outer peripheral surface 43 of the mounting substrate 4 is longer than a shortest distance W11 between the outer peripheral surface 43 of the mounting substrate 4 and a second inductor L22. In a second direction D12, a shortest distance W32 between the outer edge 1030 of the third signal terminal 103 and the outer peripheral surface 43 of the mounting substrate 4 is longer than a shortest distance W12 between the outer peripheral surface 43 of the mounting substrate 4 and the second inductor L22.

Figure 16A:
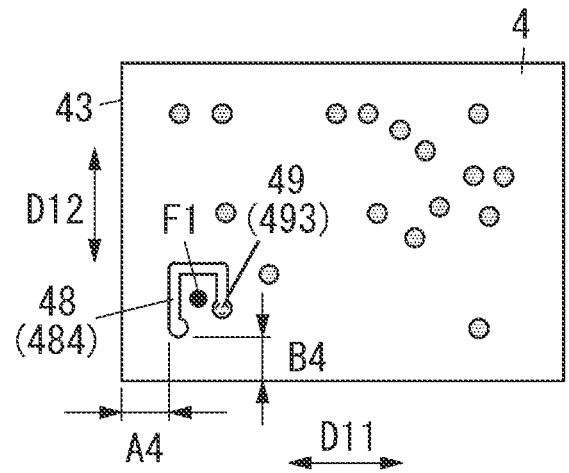
FIG. 16A is a cross-sectional view in which a circuit element disposed in the mounting substrate includes a conductor pattern portion closest to a first principal surface of the mounting substrate regarding the high frequency module.
Figure 16D:
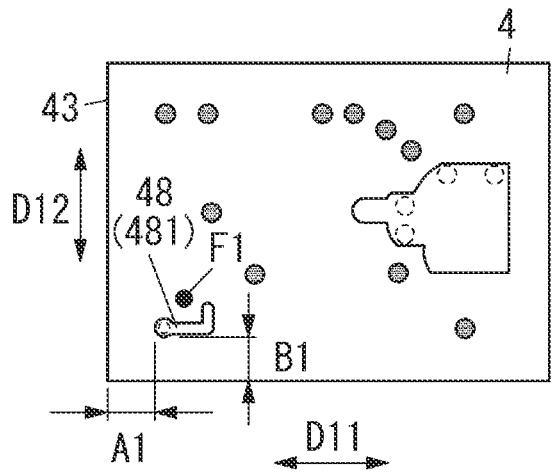
FIG. 16D is a cross-sectional view in which a circuit element disposed in the mounting substrate includes a conductor pattern portion fourth closest to the first principal surface of the mounting substrate regarding the high frequency module.
Figure 16B:
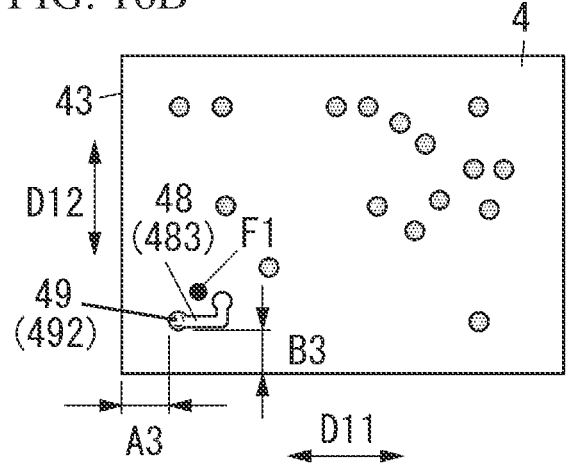
FIG. 16B is a cross-sectional view in which a circuit element disposed in the mounting substrate includes a conductor pattern portion second closest to the first principal surface of the mounting substrate regarding the high frequency module.
Figure 16E:
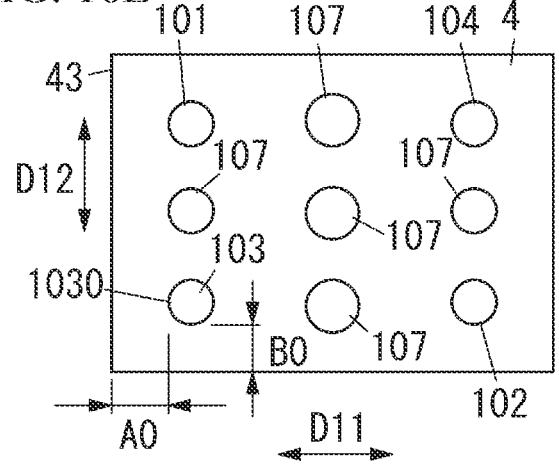
FIG. 16E is a cross-sectional view in which the mounting substrate includes first, second, third, and fourth signal terminals regarding the high frequency module.
Figure 16C:
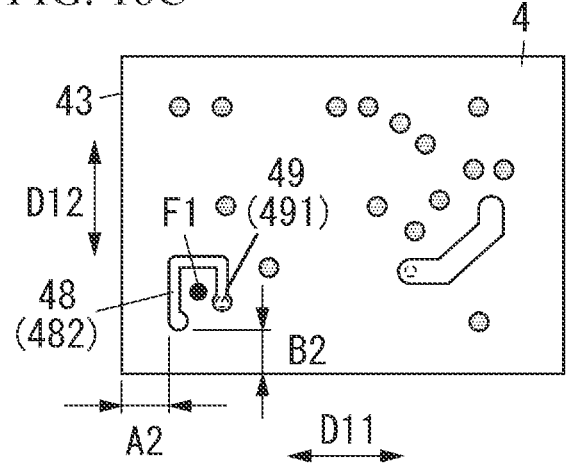
FIG. 16C is a cross-sectional view in which a circuit element disposed in the mounting substrate includes a conductor pattern portion third closest to the first principal surface of the mounting substrate regarding the high frequency module.
Figure 17:
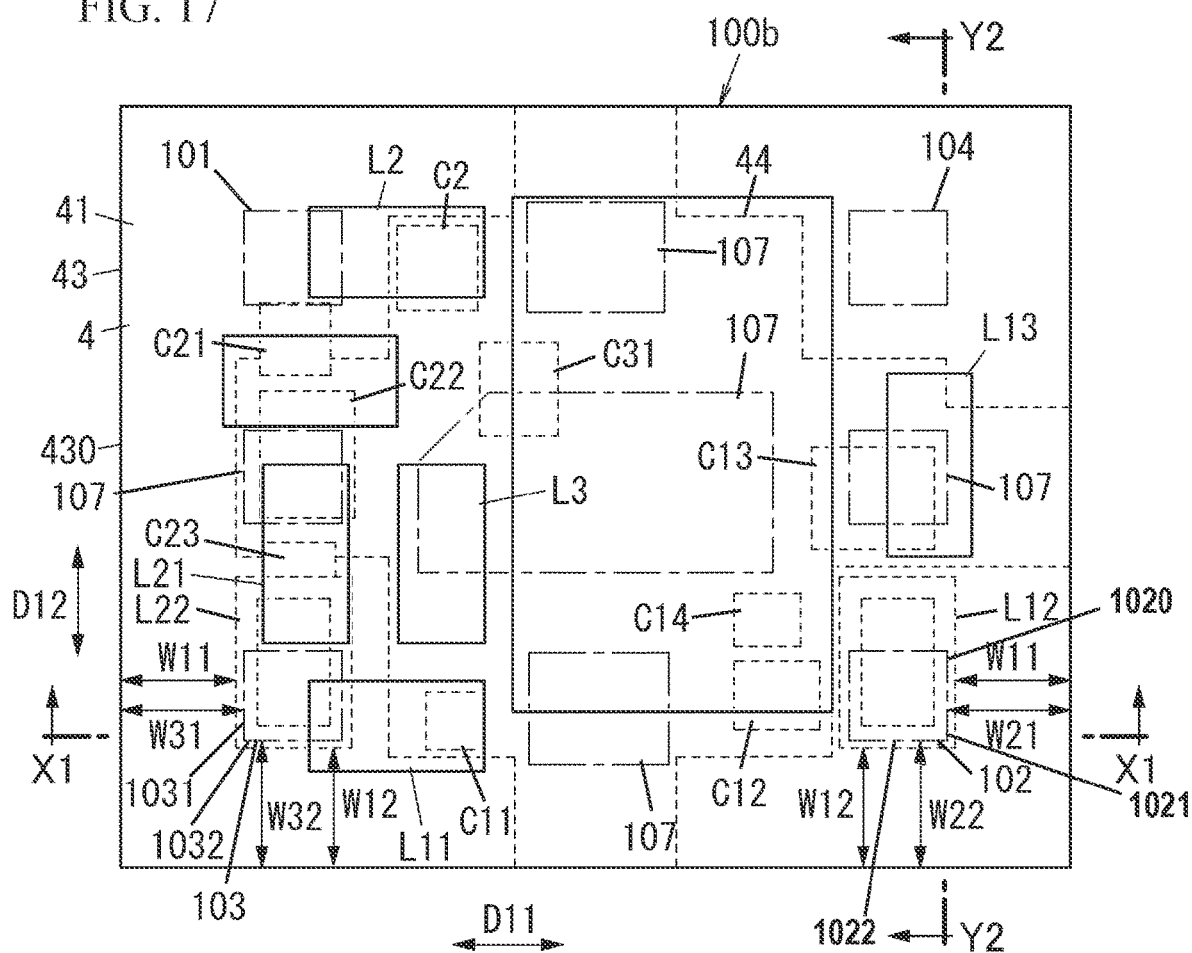
FIG. 17 is a plan view of a high frequency module according to Embodiment 3.
Figure 18:
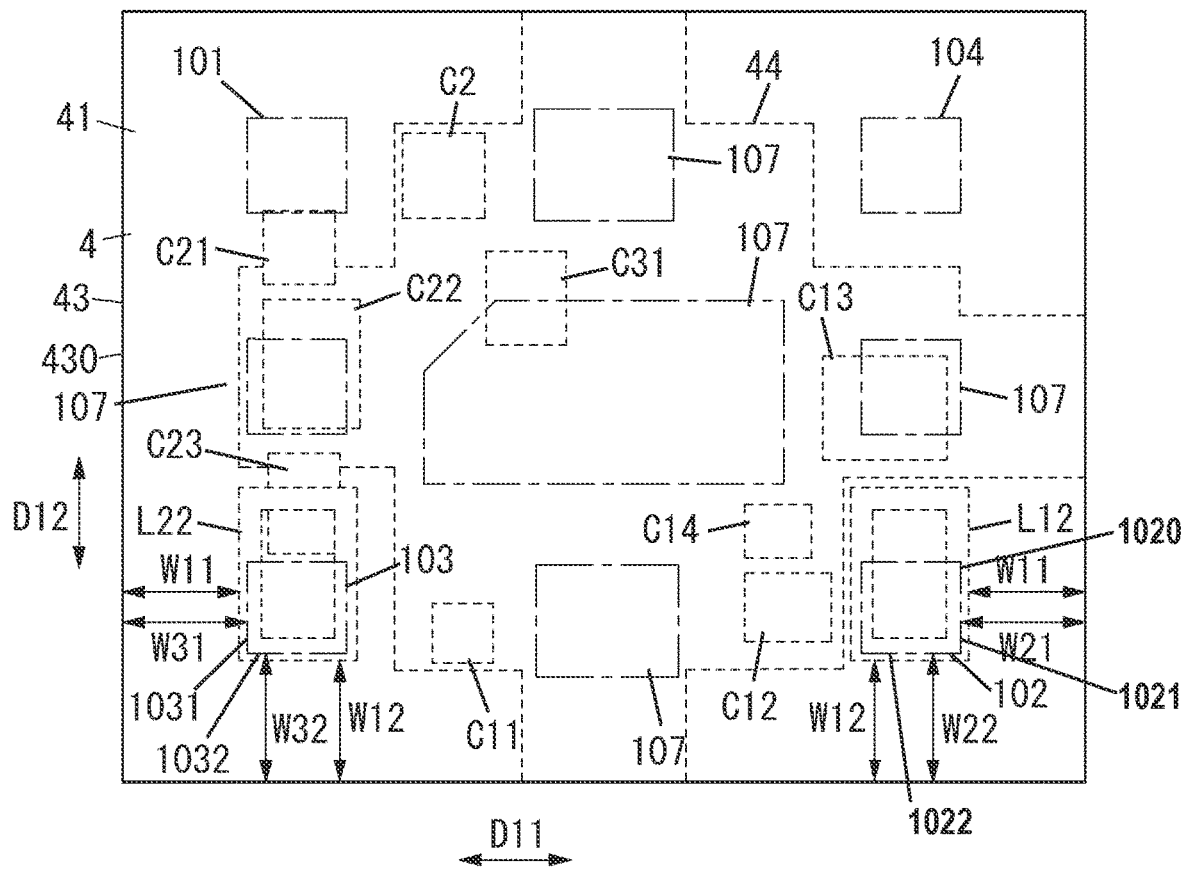
FIG. 18 is another plan view of the high frequency module.
Figure 19:
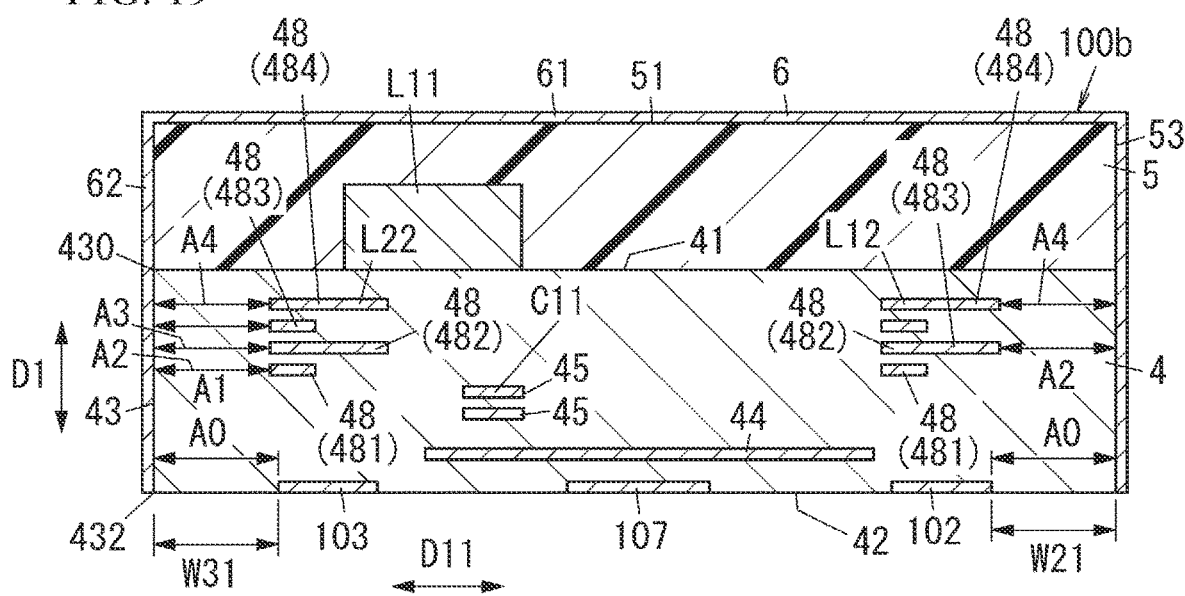
FIG. 19 illustrates a cross-sectional view of the high frequency module taken along a line X1-X1 in FIG. 17.
Figure 20:
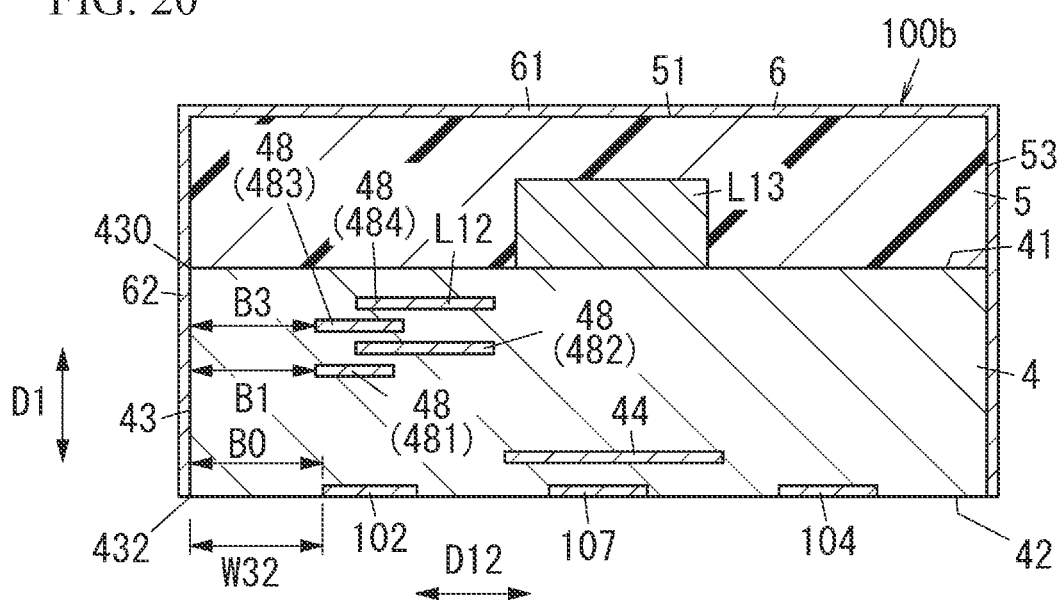
FIG. 20 illustrates a cross-sectional view of the high frequency module taken along a line Y2-Y2 in FIG. 17.

In the high frequency module 100a, the shortest distance W31 (see FIG. 14) is the same as a distance A0 between the third signal terminal 103 and the outer peripheral surface 43 of the mounting substrate 4 in the first direction D11 (see FIG. 16E). The high frequency module 100a satisfies the following conditions: distance A0>distance A1, distance A0>distance A2, distance A0>distance A3, and distance A0>distance A4. The distances A1, A2, A3, and A4 have the same value, but are not limited thereto, and may have different values from each other. In the high frequency module 100a, similar to the high frequency module 100, a second conductor 62 of a metal electrode layer 6 (see FIGS. 6 and 7) extends from an outer edge 430 of a first principal surface 41 of the mounting substrate 4 to an outer edge 432 of a second principal surface 42 of the mounting substrate 4. Accordingly, each of the distances A1, A2, A3, and A4 between each of a first, second, third, and fourth conductor pattern portions 481, 482, 483 and 484, and the outer peripheral surface 43 of the mounting substrate 4 is the same as the shortest distance between each of the first, second, third, and fourth conductor pattern portions 481, 482, 483 and 484, and the metal electrode layer 6 in the first direction D11. In the high frequency module 100a, the distance A0 between the third signal terminal 103 and the outer peripheral surface 43 of the mounting substrate 4 in the first direction D11 is the same as the shortest distance between the third signal terminal 103 and the metal electrode layer 6 in the first direction D11.

In the high frequency module 100a, the shortest distance W32 (see FIG. 14) is the same as a distance B0 between the third signal terminal 103 and the outer peripheral surface 43 of the mounting substrate 4 in the second direction D12 (see FIG. 16E). The high frequency module 100a satisfies the following conditions: distance B0>distance B1, distance B0>distance B2, distance B0>distance B3, and distance B0>distance B4. The distances B1, B2, B3, and B4 have the same value, but are not limited thereto, and may have different values from each other. In the high frequency module 100a, similar to the high frequency module 100, the second conductor 62 of the metal electrode layer 6 (see FIGS. 6 and 7) extends from the outer edge 430 of the first principal surface 41 of the mounting substrate 4 to the outer edge 432 of the second principal surface 42 of the mounting substrate 4. Accordingly, each of the distances B1, B2, B3, and B4 between each of the first, second, third, and fourth conductor pattern portions 481, 482, 483 and 484, and the outer peripheral surface 43 of the mounting substrate 4 is the same as the shortest distance between each of the first, second, third, and fourth conductor pattern portions 481, 482, 483 and 484, and the metal electrode layer 6 in the second direction D12. In the high frequency module 100a, the shortest distance B0 between the third signal terminal 103 and the outer peripheral surface 43 of the mounting substrate 4 in the second direction D12 is the same as the shortest distance between the third signal terminal 103 and the metal electrode layer 6 in the second direction D12.

In the high frequency module 100a, the shortest distances W31 and W32 have the same value, but the disclosure is not limited thereto, and the shortest distances W31 and W32 may have different values. In the case where the shortest distances W31 and W32 are different from each other, the shortest distance between the outer peripheral surface 43 of the mounting substrate 4 and the third signal terminal 103 connected to the circuit element (second inductor L22) takes the smaller value of the shortest distances W31 and W32.

The high frequency module 100a according to Embodiment 2, similar to the high frequency module 100 according to Embodiment 1, may suppress the degradation in characteristics of a hybrid filter 1. More specifically, in the high frequency module 100a, the shortest distance between the outer peripheral surface 43 of the mounting substrate 4 and the third signal terminal 103 connected to the circuit element (second inductor L22) is longer than the shortest distance between the outer peripheral surface 43 of the mounting substrate 4 and the circuit element. This makes it possible for the high frequency module 100a to suppress the degradation in characteristics of a second filter 2 caused by the parasitic capacitance generated between the metal electrode layer 6 and the third signal terminal 103 connected to the second inductor L22 of the second filter 2. As a result, the high frequency module 100a may suppress the degradation in characteristics of the hybrid filter 1.

Embodiment 3

A high frequency module 100b according to Embodiment 3 will be described with reference to FIGS. 17 to 20. As for the high frequency module 100b according to Embodiment 3, the same constituent elements as those of the high frequency module 100 according to Embodiment 1 are denoted by the same reference signs, and the description thereof will be omitted. The circuit configuration of the high frequency module 100b is the same as the circuit configuration of the high frequency module 100 according to Embodiment 1 having been described with reference to FIG. 1.

The high frequency module 100b according to Embodiment 3 is different from the high frequency module 100 according to Embodiment 1 in that a first inductor L12 of a hybrid filter 1 is a circuit element (in this case, an inner layer inductor) including a conductor pattern portion 48 formed in a mounting substrate 4. In the high frequency module 100b, among a plurality of inductors including a plurality of the first inductors L11, L12, and L13 and a plurality of second inductors L21 and L22, each of the second inductor L22 and the first inductor L12 is a circuit element including the conductor pattern portion 48 formed in the mounting substrate 4. In the high frequency module 100b, the shortest distance between an outer peripheral surface 43 of the mounting substrate 4 and a second signal terminal 102 connected to the first inductor L12 is longer than the shortest distance between the outer peripheral surface 43 of the mounting substrate 4 and the first inductor L12 (circuit element).

The high frequency module 100b according to Embodiment 3 may suppress the degradation in characteristics of the hybrid filter 1. More specifically, in the high frequency module 100b, the shortest distance between the outer peripheral surface 43 of the mounting substrate 4 and the second signal terminal 102 connected to the circuit element (first inductor L12) is longer than the shortest distance between the outer peripheral surface 43 of the mounting substrate 4 and the circuit element (first inductor L12). This makes it possible for the high frequency module 100b to suppress the degradation in characteristics of the hybrid filter 1 caused by the parasitic capacitance generated between a metal electrode layer 6 and the second signal terminal 102 connected to the first inductor L12 of the hybrid filter 1.

In the high frequency module 100b, in a plan view from a thickness direction D1 of the mounting substrate 4, the first inductor L12 does not overlap with any of the other first inductors L11 and L13, the plurality of second inductors L21 and L22, a first acoustic wave filter 10, and a second acoustic wave filter 30. In the plan view from the thickness direction D1 of the mounting substrate 4, the first inductor L12 does not overlap with any of a plurality of first capacitors C11, C12, C13, and C14 and a plurality of second capacitors C21, C22, and C23. In the plan view from the thickness direction D1 of the mounting substrate 4, the first inductor L12 does not overlap with any of an inductor L1, an inductor L2, an inductor L3, and a capacitor C2. In the plan view from the thickness direction D1 of the mounting substrate 4, the first inductor L12 does not overlap with any of an inductor L30, a capacitor C31, and a capacitor C32. In the plan view from the thickness direction D1 of the mounting substrate 4, the first inductor L12 does not overlap with a ground conductor 44. As a result, in the high frequency module 100b, the magnetic field generated in the first inductor L12, which is an inner layer inductor, is unlikely to be blocked, and thus it is possible to suppress the degradation in characteristics of the first inductor L12. The characteristics of the first inductor L12 are, for example, a quality factor (Q) value.

Modification Examples

Each of the above-described first to third embodiments is merely one of various embodiments of the present disclosure. The above-described first to third embodiments may be variously modified according to design or the like of the present disclosure can be accomplished.

For example, the multiplexer 110 constituting the high frequency module 100 is not limited to a triplexer, and may be a diplexer including only two filters of the first filter 1 and the second filter 2 among the first filter 1, second filter 2, and third filter 3. Alternatively, the multiplexer 110 may be a quadplexer including a fourth filter in addition to the first filter 1, the second filter 2, and the third filter 3.

The high frequency modules 100, 100a, and 100b are each provided with the electronic component E1 including the first acoustic wave filter 10 and the second acoustic wave filter 30, but are not limited thereto, and may include the first acoustic wave filter 10 and the second acoustic wave filter 30 as individual electronic components.

It is sufficient that the metal electrode layer 6 covers at least part of the resin layer 5 and at least part of the outer peripheral surface 43 of the mounting substrate 4 in the high frequency modules 100, 100a, and 100b. For example, an opening that exposes part of the principal surface 51 of the resin layer 5 may be formed in the metal electrode layer 6. The metal electrode layer 6 may be in contact with a principal surface on the opposite side to the mounting substrate 4 side in the acoustic wave filter 10. In the high frequency modules 100, 100a, and 100b, it is optional that the metal electrode layer 6 reaches the outer edge 432 of the second principal surface 42 of the mounting substrate 4.

In the circuit element including the conductor pattern portion 48, the conductor pattern portion 48 is not limited to the configuration being disposed in the mounting substrate 4, and may be disposed on the first principal surface 41 of the mounting substrate 4, for example. In the circuit element including the plurality of conductor pattern portions 48, one conductor pattern portion 48 among the plurality of conductor pattern portions 48 may be disposed on the first principal surface 41 of the mounting substrate 4, and the remaining conductor pattern portions 48 may be disposed within the mounting substrate 4.

The circuit elements including the conductor pattern portions 48 formed in the mounting substrate 4 are not limited to the second inductor L22 and the first inductor L12, and may be, for example, the first inductor L11. In the high frequency modules 100, 100a, and 100b, part of the second inductor L22 overlaps with part of the second capacitor C23, but the present disclosure is not limited thereto; the second inductor L22 is allowed not to overlap with the second capacitor C23. In the high frequency module 100b, the second inductor L22 may be a chip inductor.

Each of the plurality of first capacitors C11, C12, C13, and C14 and the plurality of second capacitors C21, C22, and C23 is not limited to being incorporated in the mounting substrate 4, and may be a chip capacitor.

The circuit configurations of the high frequency modules 100, 100a, and 100b are not limited to the example in FIG. 1.

The first acoustic wave filter 10 is not limited to the case of a surface acoustic wave filter, and may be a bulk acoustic wave filter. In the bulk acoustic wave filter, each of the plurality of acoustic wave resonators 14 is a bulk acoustic wave (BAW) resonator.

The second acoustic wave filter 30 is not limited to the case of a surface acoustic wave filter, and may be a bulk acoustic wave filter. In the bulk acoustic wave filter, each of the plurality of acoustic wave resonators 34 is a BAW resonator.

The acoustic wave filter 10 is not limited to a $\pi$ type filter, and may be a ladder filter. It is sufficient for the first acoustic wave filter 10 to include at least one acoustic wave resonator 14.

Each of the first acoustic wave filter 10 and the second acoustic wave filter 30 may be an acoustic wave filter utilizing, for example, boundary acoustic waves or plate waves.

Figure 11:
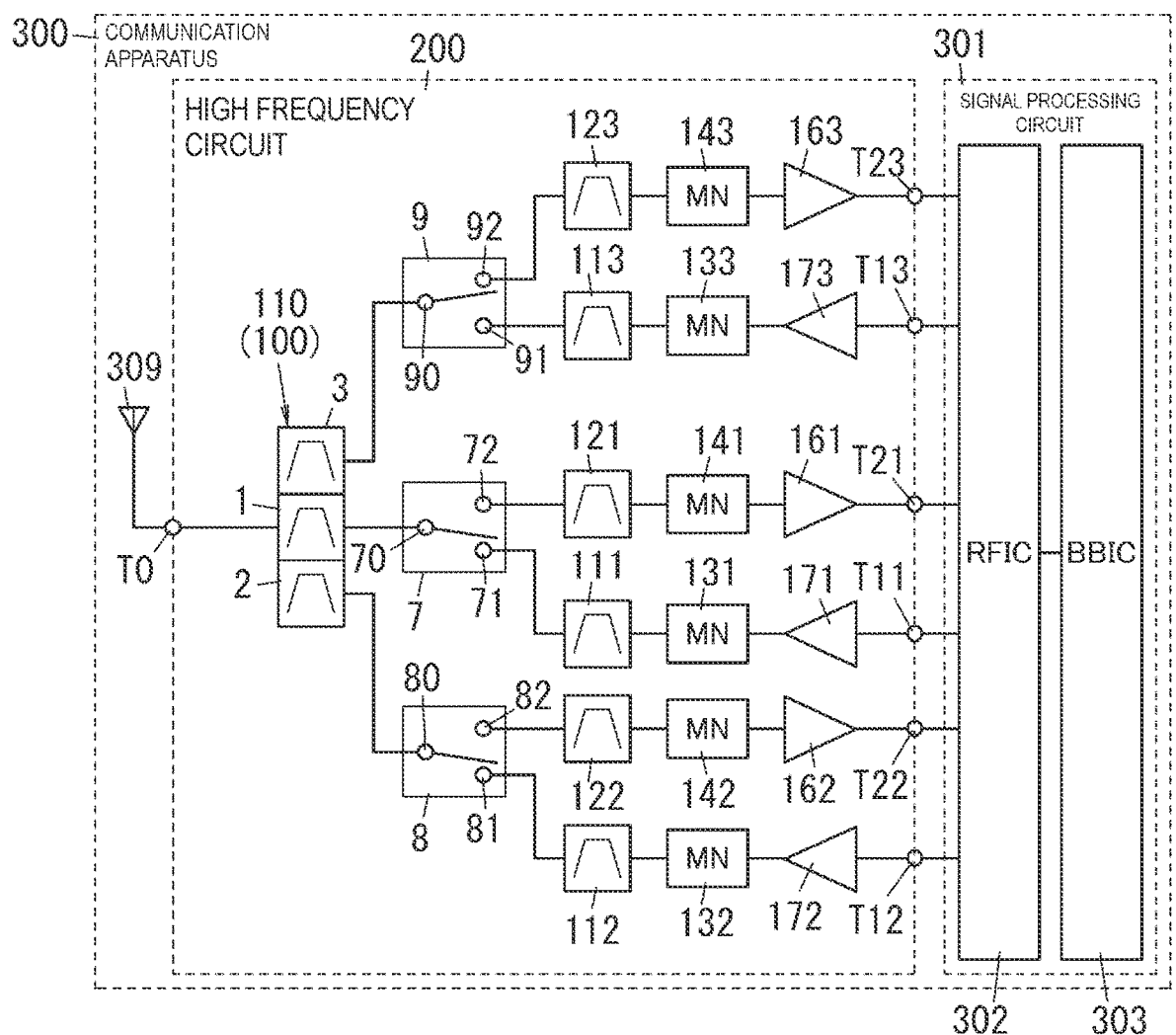
FIG. 11 is a circuit configuration diagram of a communication apparatus including the high frequency module.

The circuit configuration of the high frequency circuit 200 is not limited to the example in FIG. 11. The high frequency circuit 200 may include, for example, a high frequency front-end circuit configured to support multi input multi output (MIMO) or evolved-universal terrestrial radio access new radio dual connectivity (ENDC), as a circuit configuration.

Aspects

The following aspects are disclosed herein.

A high frequency module (100; 100a; 100b) according to a first aspect includes a mounting substrate (4), a first signal terminal (101), a second signal terminal (102), a third signal terminal (103), a ground terminal (107), a first filter (1), and a second filter (2). The mounting substrate (4) has a first principal surface (41) and a second principal surface (42) opposing each other. The first signal terminal (101), the second signal terminal (102), the third signal terminal (103), and the ground terminal (107) are disposed on the second principal surface (42) of the mounting substrate (4). The first filter (1) is connected between the first signal terminal (101) and the second signal terminal (102). The first filter (1) is a hybrid filter (1) including an acoustic wave filter (10), a plurality of first inductors (L11, L12, and L13), and a plurality of first capacitors (C11, C12, C13, and C14). The acoustic wave filter (10) includes at least one acoustic wave resonator (14). The second filter (2) is connected between the first signal terminal (101) and the third signal terminal (103). The second filter (2) includes a plurality of second inductors (L21 and L22) and a plurality of second capacitors (C21, C22, and C23). A pass band width of the hybrid filter (1) is larger than a pass band width of the acoustic wave resonator (14). The acoustic wave filter (10) is mounted on the first principal surface (41) of the mounting substrate (4). The plurality of first inductors (L11, L12, and L13), the plurality of first capacitors (C11, C12, C13, and C14), the plurality of second inductors (L21 and L22), and the plurality of second capacitors (C21, C22, and C23) are disposed in or on the mounting substrate (4). The high frequency module (100; 100*a*; 100*b*) further includes a resin layer (5) and a metal electrode layer (6). The resin layer (5) is disposed on the first principal surface (41) of the mounting substrate (4) and covers at least part of the acoustic wave filter (10). The metal electrode layer (6) covers at least part of the resin layer (5) and at least part of an outer peripheral surface (43) of the mounting substrate (4). The metal electrode layer (6) is connected to a ground terminal (107). At least one inductor (the second inductor L22; the first inductor L11; the first inductor L12; the first inductor L13) among a plurality of inductors including the plurality of first inductors (L11, L12, and L13) and the plurality of second inductors (L21 and L22) is a circuit element including a conductor pattern portion (48) formed in the mounting substrate (4). A shortest distance between the outer peripheral surface (43) of the mounting substrate (4) and a signal terminal out of the second signal terminal (102) and the third signal terminal (103) connected to the circuit element is longer than a shortest distance between the outer peripheral surface (43) of the mounting substrate (4) and the circuit element.

The high frequency module (100; 100*a*; 100*b*) according to the first aspect may reduce the influence of parasitic capacitance generated between the outer peripheral surface (43) of the mounting substrate (4), a signal terminal out of the second signal terminal (102) and the third signal terminal (103) connected to the circuit element, and the metal electrode layer (6), and may suppress the degradation in characteristics of the hybrid filter (1).

A high frequency module (100; 100*a*) according to a second aspect is such that, in the first aspect, the at least one inductor is an inductor (second inductor L22) connected between the first signal terminal (101) and the third signal terminal (103).

In the high frequency module (100; 100*a*) according to the second aspect, because the shortest distance between the outer peripheral surface (43) of the mounting substrate (4) and the third signal terminal (103) is longer than the shortest distance between the outer peripheral surface (43) of the mounting substrate (4) and the circuit element (second inductor L22), it is possible to suppress the degradation in characteristics of the second filter (2) caused by the parasitic capacitance generated between the third signal terminal (103) connected to the circuit element (second inductor L22) and the metal electrode layer (6). This makes it possible for the high frequency module (100; 100*a*) according to the second aspect to suppress the degradation in characteristics of the hybrid filter (1) connected to the first signal terminal (101) together with the second filter (2).

A high frequency module (100*b*) according to a third aspect is such that, in the first aspect, the at least one inductor is an inductor (first inductor L11; first inductor L12; first inductor L13) connected in series to the acoustic wave filter (10) between the first signal terminal (101) and the second signal terminal (102).

In the high frequency module (100*b*) according to the third aspect, because the shortest distance between the outer peripheral surface (43) of the mounting substrate (4) and the second signal terminal (102) is longer than the shortest distance between the outer peripheral surface (43) of the mounting substrate (4) and the circuit element (first inductor L11; first inductor L12), it is possible to suppress the degradation in characteristics of the hybrid filter (1) caused by the parasitic capacitance generated between the second signal terminal (102) connected to the circuit element (first inductor L11; first inductor L12) and the metal electrode layer (6).

A high frequency module (100; 100*a*; 100*b*) according to a fourth aspect includes a plurality of the circuit elements in any one of the first to third aspects. In the high frequency module (100; 100*a*; 100*b*) according to the fourth aspect, as for each of the plurality of circuit elements, the shortest distance between the outer peripheral surface (43) of the mounting substrate (4) and the signal terminal (third signal terminal 103; second signal terminal 102) out of the second signal terminal (102) and the third signal terminal (103) connected to the circuit element is longer than the shortest distance between the outer peripheral surface (43) of the mounting substrate (4) and the circuit element (second inductor L22; first inductor L11; first inductor L12).

The high frequency module (100; 100*a*; 100*b*) according to the fourth aspect may further suppress the degradation in characteristics of the hybrid filter (1).

A high frequency module (100; 100*b*) according to a fifth aspect is such that, in any one of the first to fourth aspects, the mounting substrate (4) has a rectangular shape in a plan view from the thickness direction (D1) of the mounting substrate (4). The signal terminal (third signal terminal 103; second signal terminal 102) connected to the circuit element is disposed in any of a first corner (421), a second corner (422), a third corner (423), and a fourth corner (424) of the second principal surface (42) of the mounting substrate (4). The signal terminal (third signal terminal 103; second signal terminal 102) connected to the circuit element has a rectangular shape in the plan view from the thickness direction (D1) of the mounting substrate (4). In the plan view from the thickness direction (D1) of the mounting substrate (4), an outer edge (1030; 1020) of the signal terminal (third signal terminal 103; second signal terminal 102) includes a first side (1031; 1021) adjacent to an outer edge (432) of the second principal surface (42) of the mounting substrate (4) in a first direction (D11) and a second side (1032; 1022) adjacent to the outer edge (432) of the second principal surface (42) of the mounting substrate (4) in a second direction (D12) orthogonal to the first direction (D11). The shortest distance between the first side (1031; 1021) in the outer edge (1030; 1020) of the signal terminal (third signal terminal 103; second signal terminal 102) connected to the circuit element and the outer peripheral surface (43) of the mounting substrate (4) is longer than the shortest distance between the outer peripheral surface (43) of the mounting substrate (4) and the circuit element. The shortest distance between the second side (1032; 1022) in the outer edge (1030; 1020) of the signal terminal (103; 102) connected to the circuit element and the outer peripheral surface (43) of the mounting substrate (4) is longer than the shortest distance between the outer peripheral surface (43) of the mounting substrate (4) and the circuit element.

The high frequency module (100; 100*b*) according to the fifth aspect may further suppress the degradation in characteristics of the hybrid filter (1).

A high frequency module (100; 100*a*; 100*b*) according to a sixth aspect is such that, in any one of the first to fifth aspects, the mounting substrate (4) includes a ground conductor (44). The ground conductor (44) is disposed between the first principal surface (41) and the second principal surface (42) of the mounting substrate (4), and is connected to the ground terminal (107). In a plan view from the thickness direction (D1) of the mounting substrate (4), the circuit element does not overlap with the ground conductor 44.

The high frequency module (100; 100*a*; 100*b*) according to the sixth aspect may suppress the generation of unwanted parasitic capacitance between the circuit element (second inductor L22) and the ground conductor (44).

A high frequency module (100; 100a; 100b) according to a seventh aspect is such that, in any one of the first to sixth aspects, the circuit element (second inductor L22) does not overlap with any of a plurality of electronic components disposed on the first principal surface (41) of the mounting substrate (4) in a plan view from the thickness direction (D1) of the mounting substrate (4). The plurality of electronic components is two or more electronic components other than the circuit elements among a group of the acoustic wave filter (10), the plurality of first inductors (L11, L12, and L13), the plurality of first capacitors (C11, C12, C13, and C14), the plurality of second inductors (L21 and L22), and the plurality of second capacitors (C21, C22, and C23).

The high frequency module (100; 100a; 100b) according to the seventh aspect may suppress the degradation in characteristics of the circuit element (second inductor L22) because the magnetic field generated in the circuit element (second inductor L22) is unlikely to be blocked by the plurality of electronic components disposed on the first principal surface (41) of the mounting substrate (4).

A high frequency module (100; 100a; 100b) according to an eighth aspect further includes a fourth signal terminal (104) and a third filter (3) in any one of the first to fourth aspects. The fourth signal terminal (104) is disposed on the second principal surface (42) of the mounting substrate (4). The third filter (3) is connected between the first signal terminal (101) and the fourth signal terminal (104). The mounting substrate (4) has a rectangular shape in a plan view from the thickness direction (D1) of the mounting substrate (4). The first signal terminal (101), the second signal terminal (102), the third signal terminal (103), and the fourth signal terminal (104) are disposed in the first corner (421), the second corner (422), the third corner (423), and the fourth corner (424), respectively, of the second principal surface (42) of the mounting substrate (4).

The high frequency module (100; 100a; 100b) according to the eighth aspect may improve the isolation between the first filter (1) and the second filter (2), the isolation between the first filter (1) and the third filter (3), and the isolation between the second filter (2) and the third filter (3). As a result, the high frequency module (100; 100a; 100b) according to the eighth aspect may further suppress the degradation in characteristics of the hybrid filter (1).

A high frequency module (100; 100a; 100b) according to a ninth aspect is such that, in the eighth aspect, the mounting substrate (4) includes the ground conductor (44). The ground conductor (44) is disposed between the first principal surface (41) and the second principal surface (42) of the mounting substrate (4), and is connected to the ground terminal (107). The first signal terminal (101), the second signal terminal (102), the third signal terminal (103), and the fourth signal terminal (104) do not overlap with the ground conductor (44) in a plan view from the thickness direction (D1) of the mounting substrate (4).

The high frequency module (100; 100a; 100b) according to the ninth aspect may reduce the parasitic capacitance generated between the ground conductor 44 and each of the first signal terminal (101), the second signal terminal (102), the third signal terminal (103), and the fourth signal terminal (104).

A high frequency module (100; 100a; 100b) according to a tenth aspect is such that, in any one of the first to ninth aspects, a portion (second conductor 62) of the metal electrode layer (6) covering at least part of the outer peripheral surface (43) of the mounting substrate (4) extends from an outer edge (430) of the first principal surface (41) of the mounting substrate (4) to the outer edge (432) of the second principal surface (42) of the mounting substrate (4).

The high frequency module (100; 100a; 100b) according to the tenth aspect may improve shielding characteristics by the metal electrode layer (6), and may suppress the degradation in characteristics of the hybrid filter (1).

A communication apparatus (300) according to an eleventh aspect includes the high frequency module (100; 100a; 100b) according to any one of the first to tenth aspects, and a signal processing circuit (301). The signal processing circuit (301) is connected to the high frequency module (100; 100a; 100b).

The communication apparatus (300) according to the eleventh aspect may suppress the degradation in the characteristics of the hybrid filter (1).

What is claimed is:

1. A high frequency module, comprising:
    a mounting substrate having a first principal surface and a second principal surface opposing each other;
    a first signal terminal, a second signal terminal, a third signal terminal, and a ground terminal on the second principal surface of the mounting substrate;
    a first filter that is connected between the first signal terminal and the second signal terminal, and is a hybrid filter comprising an acoustic wave filter, a plurality of first inductors, and a plurality of first capacitors, the acoustic wave filter comprising at least one acoustic resonator; and
    a second filter connected between the first signal terminal and the third signal terminal, and comprising a plurality of second inductors and a plurality of second capacitors,
    wherein a pass band width of the hybrid filter is greater than a pass band width of the acoustic wave filter,
    wherein the acoustic wave filter is mounted on the first principal surface of the mounting substrate,
    wherein the plurality of first inductors, the plurality of first capacitors, the plurality of second inductors, and the plurality of second capacitors are in or on the mounting substrate,
    wherein the high frequency module further comprises:
        a resin layer on the first principal surface of the mounting substrate and covering at least part of the acoustic wave filter, and
        a metal electrode layer covering at least part of the resin layer and at least part of an outer peripheral surface of the mounting substrate, and connected to the ground terminal,
    wherein at least one of the plurality of first and second inductors is a circuit element comprising a conductor pattern portion in the mounting substrate, and
    wherein a shortest distance between the outer peripheral surface of the mounting substrate and the second or third signal terminal connected to the circuit element is longer than a shortest distance between the outer peripheral surface of the mounting substrate and the circuit element.

2. The high frequency module according to claim 1, wherein the at least one of the plurality of first and second inductors is connected between the first signal terminal and the third signal terminal.

3. The high frequency module according to claim 1, wherein the at least one of the plurality of first and second inductors is connected in series to the acoustic wave filter between the first signal terminal and the second signal terminal.

4. The high frequency module according to claim 1, further comprising:
a plurality of the circuit elements,
wherein, for each of the plurality of circuit elements, the shortest distance between the outer peripheral surface of the mounting substrate and the second or third signal terminal connected to the circuit element is longer than the shortest distance between the outer peripheral surface of the mounting substrate and the circuit element.

5. The high frequency module according to claim 1,
wherein the mounting substrate has a rectangular shape in a plan view from the thickness direction of the mounting substrate,
wherein the signal terminal connected to the circuit element is in a first corner, a second corner, a third corner, or a fourth corner of the second principal surface of the mounting substrate,
wherein the signal terminal connected to the circuit element has a rectangular shape in the plan view from the thickness direction of the mounting substrate,
wherein in the plan view from the thickness direction of the mounting substrate, an outer edge of the signal terminal comprises:
  a first side adjacent to an outer edge of the second principal surface of the mounting substrate in a first direction, and
  a second side adjacent to the outer edge of the second principal surface of the mounting substrate in a second direction orthogonal to the first direction,
wherein the shortest distance between the first side adjacent to the outer edge of the signal terminal connected to the circuit element and the outer peripheral surface of the mounting substrate is longer than the shortest distance between the outer peripheral surface of the mounting substrate and the circuit element, and
wherein the shortest distance between the second side adjacent to the outer edge of the signal terminal connected to the circuit element and the outer peripheral surface of the mounting substrate is longer than the shortest distance between the outer peripheral surface of the mounting substrate and the circuit element.

6. The high frequency module according to claim 1,
wherein the mounting substrate comprises a ground conductor between the first principal surface and the second principal surface in a thickness direction of the mounting substrate, and that is connected to the ground terminal, and
wherein the circuit element does not overlap the ground conductor in a plan view from the thickness direction of the mounting substrate.

7. The high frequency module according to claim 1,
wherein the circuit element does not overlap any of a plurality of electronic components on the first principal surface of the mounting substrate in a plan view from the thickness direction of the mounting substrate, and
wherein the plurality of electronic components is two or more electronic components other than the acoustic wave filter, the plurality of first inductors, the plurality of first capacitors, the plurality of second inductors, and the plurality of second capacitors.

8. The high frequency module according to claim 1, further comprising:
a fourth signal terminal on the second principal surface of the mounting substrate; and
a third filter connected between the first signal terminal and the fourth signal terminal,
wherein the mounting substrate has a rectangular shape in a plan view from the thickness direction of the mounting substrate, and
wherein the first signal terminal, the second signal terminal, the third signal terminal, and the fourth signal terminal are in a first corner, a second corner, a third corner, and a fourth corner, respectively, of the second principal surface of the mounting substrate.

9. The high frequency module according to claim 8,
wherein the mounting substrate comprises a ground conductor between the first principal surface and the second principal surface in the thickness direction of the mounting substrate, and that is connected to the ground terminal, and
wherein the first signal terminal, the second signal terminal, the third signal terminal, and the fourth signal terminal do not overlap the ground conductor in a plan view from the thickness direction of the mounting substrate.

10. The high frequency module according to claim 1, wherein a portion of the metal electrode layer covering at least part of the outer peripheral surface of the mounting substrate extends from an outer edge of the first principal surface of the mounting substrate to the outer edge of the second principal surface of the mounting substrate.

11. A communication apparatus, comprising:
the high frequency module according to claim 1; and
a signal processing circuit connected to the high frequency module.

* * * * *